(12) United States Patent
Nohtomi

(10) Patent No.: US 11,556,212 B2
(45) Date of Patent: Jan. 17, 2023

(54) DEVICE AND METHOD FOR CAPACITIVE SENSING

(71) Applicant: Synaptics Incorporated, San Jose, CA (US)

(72) Inventor: Shinobu Nohtomi, Tokyo (JP)

(73) Assignee: Synaptics Incorporated, San Jose, CA (US)

( * ) Notice: Subject to any disclaimer, the term of this patent is extended or adjusted under 35 U.S.C. 154(b) by 238 days.

(21) Appl. No.: 17/170,074

(22) Filed: Feb. 8, 2021

(65) Prior Publication Data

US 2022/0252648 A1    Aug. 11, 2022

(51) Int. Cl.
*G06F 3/044* (2006.01)
*G01R 27/26* (2006.01)
*G06F 3/041* (2006.01)
*H03K 17/96* (2006.01)

(52) U.S. Cl.
CPC ......... *G06F 3/044* (2013.01); *G01R 27/2605* (2013.01); *G06F 3/04164* (2019.05); *G06F 3/04184* (2019.05); *H03K 17/962* (2013.01)

(58) Field of Classification Search
CPC . G01R 27/2605; G06F 3/044; G06F 3/04164; G06F 3/04166; G06F 3/04184; H03K 17/962
See application file for complete search history.

(56) References Cited

U.S. PATENT DOCUMENTS

| | | | |
|---|---|---|---|
| 10,928,944 B1* | 2/2021 | Nohtomi | H03K 17/955 |
| 2015/0193082 A1* | 7/2015 | Ludden | G02F 1/13338 345/174 |
| 2017/0187551 A1* | 6/2017 | Lukanc | H04W 72/0413 |
| 2017/0237438 A1* | 8/2017 | Terletzki | H03K 19/018521 326/81 |

* cited by examiner

*Primary Examiner* — Amy He
(74) *Attorney, Agent, or Firm* — Ferguson Braswell Fraser Kubasta PC

(57) ABSTRACT

A processing system includes a level shifter, a drive circuit, and a capacitive sensing circuit. The level shifter is configured to generate a first level-shifted output corresponding to a graylevel value and a second level-shifted output corresponding to capacitive sensing control data. The drive circuit is configured to generate an output voltage based at least in part on the first level-shifted output. The capacitive sensing circuit is configured to receive a resulting signal from a sensor electrode and generate, based at least in part on the second level-shifted output, a capacitive sensing output corresponding to the resulting signal.

20 Claims, 14 Drawing Sheets

DEVICE AND METHOD FOR CAPACITIVE SENSING

FIELD

The disclosed technology generally relates to devices and methods for capacitive sensing.

BACKGROUND

Input devices including proximity sensor devices may be used in a variety of electronic systems to provide interfaces for the electronic systems. A proximity sensor device may include a sensing region, demarcated by a surface, in which the proximity sensor device determines the presence, location, force and/or motion of one or more input objects. A proximity sensor device may be based on capacitive sensing using an array of sensor electrodes provided in the sensing region. In various implementations, resulting signals are acquired from the array of sensor electrodes and the capacitive sensing is achieved based on the resulting signals.

SUMMARY

This summary is provided to introduce in a simplified form a selection of concepts that are further described below in the detailed description. This summary is not intended to identify key features or essential features of the claimed subject matter, nor is it intended to limit the scope of the claimed subject matter.

In one or more embodiments, a processing system is provided. The processing system includes a level shifter, a drive circuit, and a capacitive sensing circuit. The level shifter is configured to generate a first level-shifted output corresponding to a graylevel value and a second level-shifted output corresponding to capacitive sensing control data. The drive circuit is configured to generate an output voltage based at least in part on the first level-shifted output. The capacitive sensing circuit is configured to receive a resulting signal from a sensor electrode and generate, based at least in part on the second level-shifted output, a capacitive sensing output corresponding to the resulting signal.

In one or more embodiments, an input device is provided. The input device includes a sensor electrode, a display panel comprising a display element, and a processing system. The processing system includes a level shifter, a drive circuit, and a capacitive sensing circuit. The level shifter is configured to generate a first level-shifted output corresponding to a graylevel value and a second level-shifted output corresponding to capacitive sensing control data. The capacitive sensing circuit is configured to receive a resulting signal from a sensor electrode and generate, based at least in part on the second level-shifted output, a capacitive sensing output corresponding to the resulting signal.

In one or more embodiments, a method for operating a processing system is provided. The method includes generating, by a level shifter, a first level-shifted output corresponding to a graylevel value and a second level-shifted output corresponding to capacitive sensing control data. The method further includes generating an output voltage based at least in part on the first level-shifted output. The method further includes receiving a resulting signal from a sensor electrode and generating, based at least in part on the second level-shifted output, a capacitive sensing output corresponding to the resulting signal.

Other aspects of the embodiments will be apparent from the following description and the appended claims.

BRIEF DESCRIPTION OF DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

DETAILED DESCRIPTION

Figure 1:
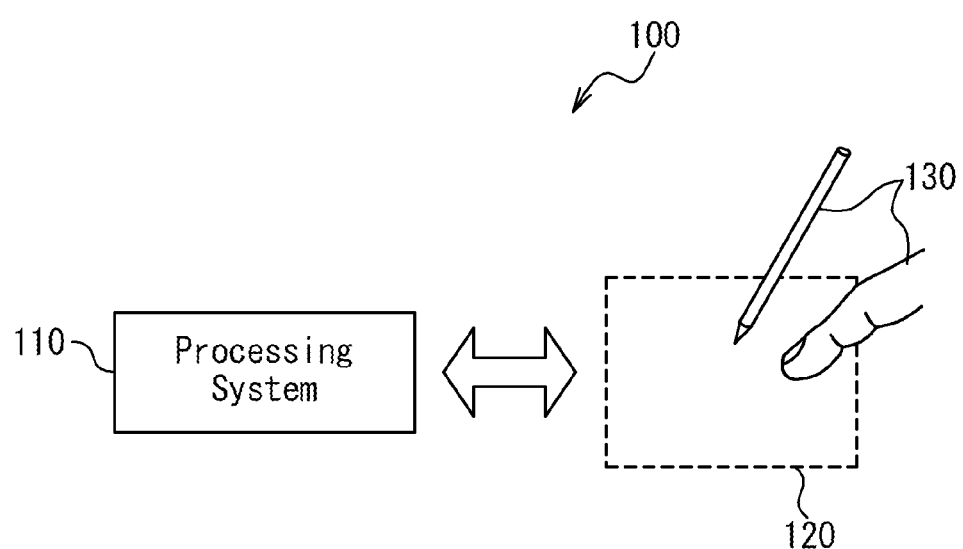
FIG. 1 illustrates an example input device, according to one or more embodiments.

The following detailed description is merely exemplary in nature and is not intended to limit the disclosure or the application and uses of the disclosure. Furthermore, there is no intention to be bound by any expressed or implied theory presented in the preceding background, summary, or the following detailed description.

An input device may be configured to detect an input object in a sensing region through capacitive sensing (e.g., capacitive proximity sensing). In various implementations, an array of sensor electrodes is disposed in the sensing region and the input object is sensed based on resulting signals acquired from the array of sensor electrodes, where the resulting signals include information of the capacitances of the sensor electrodes.

An input device adapted to capacitive sensing may include a set of capacitive sensing circuits configured to generate capacitive sensing outputs corresponding to resulting signals acquired from the sensor electrodes. The capacitive sensing circuits may include various analog circuits configured to process analog signals, including the resulting signals acquired from the array of sensor electrodes and signals generated from the resulting signals. Examples of the analog circuits include a buffer amplifier, a current conveyer, a filter, an analog-to-digital converter and other circuits configured to process analog signals. The analog circuits integrated in the capacitive sensing circuits may operate under control of logic circuitry configured to adjust properties (e.g., the gain, the frequency response characteristics, the time gate window, or the like) of the analog circuits.

Voltage level of the analog circuits may be incompatible with voltage level of the logic circuitry. For example, the input voltage level of the analog circuits may be different from the output voltage level of the logic circuitry. In one implementation, an analog circuit integrated in the capacitive sensing circuit may be configured to operate on a negative power supply voltage and adapted to a negative input voltage level, while the logic circuitry may be configured to generate a control signal which may be of a logic level, e.g., a positive voltage level.

One approach to address voltage incompatibility between the logic circuitry and the analog circuit is to use a level shifter configured to provide level shifting or voltage level translation. The level shifting or voltage level translation may be an operation that matches the output voltage level of one circuit with the input voltage level of a different circuit. In one implementation, a level shifter may be configured to receive a control signal from the logic circuitry and provide a corresponding level-shifted output compatible to the input voltage level of the analog circuit. A level shifter can increase silicon area, especially a level shifter that is configured to output a negative level-shifted output, which in turn can undesirably increase the cost of the input device adapted to capacitive sensing. The present disclosure provides various techniques to address the voltage incompatibility issue between logic circuitry and an analog circuit integrated in a capacitive sensing circuit.

In one or more embodiments, a processing system includes a level shifter, a drive circuit, and a capacitive sensing circuit. The level shifter is configured to generate a first level-shifted output corresponding to a graylevel value and a second level-shifted output corresponding to capacitive sensing control data. The drive circuit is configured to generate an output voltage based at least in part on the first level-shifted output. The capacitive sensing circuit is configured to receive a resulting signal from a sensor electrode and generate, based at least in part on the second level-shifted output, a capacitive sensing output corresponding to the resulting signal. In the processing system thus configured, the level shifter is used for controlling both the drive circuit and the capacitive sensing circuit, effectively reducing the silicon area of the processing system.

FIG. 1 illustrates an example input device 100, according to one or more embodiments. The input device 100 may be configured to provide input to an electronic system (not shown). The term "electronic system" broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices, e.g., remote controllers and mice, and data output devices, e.g., display screens and printers. Other examples include automotive user interfaces configured to give drivers user interface capabilities. Other examples include remote terminals, kiosks, and video game machines, e.g., video game consoles, portable gaming devices, and the like. Other examples include communication devices, e.g., cellular phones such as smart phones, and media devices, e.g., recorders, editors, and players such as televisions, set-top boxes, music players, digital photo frames, and digital cameras. Additionally, the electronic system could be a host or a slave to the input device. The electronic system may also be referred to as electronic device. The input device 100 can be implemented as a physical part of the electronic system, or can be physically separate from the electronic system. In one embodiment, the electronic system may be referred to as an external entity. As appropriate, the input device 100 may communicate with parts of the electronic system using any one or more of the following: buses, networks, and other wired or wireless interconnections.

In the illustrated embodiment, the input device 100 is shown as a proximity sensor device configured to sense input provided by one or more input objects 130 in a sensing region 120. Example input objects 130 include fingers and styli, as shown in FIG. 1. An exemplary proximity sensor device may be a touchpad, a touch screen, a touch sensor device and the like.

The sensing region 120 encompasses any space above, around, in and/or near the input device 100 in which the input device 100 is able to detect user input, e.g., user input provided by one or more input objects 130. The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiment's sense input includes no contact with any surfaces of the input device 100, contact with an input surface, e.g., a touch surface, of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

In various implementations, the input device 100 is configured to sense one or more input object 130 through capacitive sensing (e.g., capacitive proximity sensing). Some capacitive implementations utilize "absolute capacitance" (also often referred to as "self-capacitance") sensing methods based on changes in the capacitive coupling between sensor electrodes and an input object (e.g., between a system ground and freespace coupling to the user). In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage, e.g., system ground, and by detecting the capacitive coupling between the sensor electrodes and input objects. The sensor electrodes may be disposed over a display of a display device. The sensing electrodes may be formed on a common substrate of a display device (e.g., on the encapsulation layer of a rigid or flexible organic light emitting diode (OLED) display).

Some capacitive implementations utilize "transcapacitance" (also often referred to as "mutual capacitance") sensing methods based on changes in the capacitive coupling between transmitter electrodes and sensor electrodes. In various embodiments, an input object near the sensor electrodes alters the electric field between the transmitter electrodes and the sensor electrodes, thus changing the measured capacitive coupling. In one implementation, a transcapacitance sensing method operates by detecting the capacitive coupling between one or more transmitter electrodes and one or more sensor electrodes. The coupling may be reduced when an input object coupled to a system ground approaches the sensor electrodes. Transmitter electrodes may be modulated relative to a reference voltage, e.g., system ground. Sensor electrodes may be held substantially constant relative to the reference voltage or modulated relative to the transmitter electrodes to facilitate receipt of resulting signals. A resulting signal may include effect(s) corresponding to one or more transmitter signals, and/or to one or more sources of environmental interference, e.g., other electromagnetic signals. Sensor electrodes may be dedicated transmitters or receivers, or may be configured to both transmit and receive.

In FIG. 1, a processing system 110 is shown as part of the input device 100. The processing system 110 is configured to operate the hardware of the input device 100 to detect input in the sensing region 120. The processing system 110 may include parts of or all of one or more integrated circuits (ICs) chips and/or other circuitry components.

In some embodiments, the input device 100 includes a proximity sensing interface, and the sensing region 120 overlaps at least part of a display screen. For example, the sensing region 120 may overlap at least a portion of an active area of a display screen (or display panel). The active area of the display panel may correspond to a portion of the display panel where images are updated. In one or more embodiments, the input device 100 may include substantially transparent sensor electrodes (e.g., indium tin oxide (ITO), metal mesh, etc.) overlaying the display screen and provide a user interface for the associated electronic system. The display panel may be any type of dynamic display capable of displaying a visual interface to a user, and may include any type of liquid crystal display (LCD), light emitting diode (LED), organic light emitting diode (OLED), or other display technology. The input device 100 and the display panel may share physical elements. For example, some embodiments may utilize some of the same electrical components for displaying and sensing. As another example, the display panel may be operated in part or in total by the processing system 110.

Figure 2:
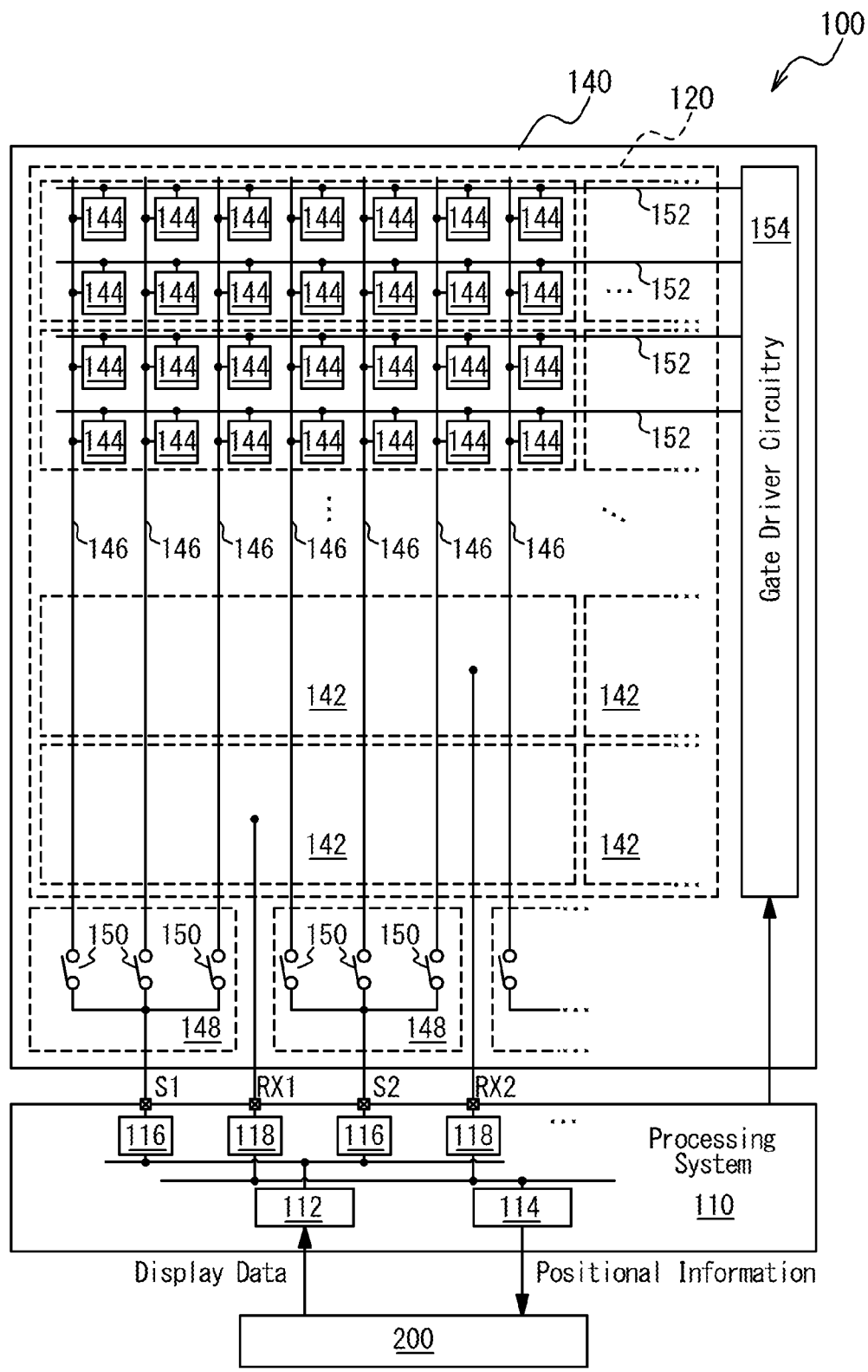
FIG. 2 illustrates an example configuration of an input device, according to one or more embodiments.

FIG. 2 illustrates an example configuration of the input device 100, according to one or more embodiments. In the illustrated embodiment, the processing system 110 is coupled to a display panel 140, such as a liquid crystal display (LCD) panel or an organic light emitting diode (OLED) panel. The term "coupled" as used herein means connected directly to or connected through one or more intervening components or circuits.

The processing system 110 may be configured to detect a contact or an approach of an input object, such as the input object 130, to the display panel 140 through capacitive sensing and generate positional information of the input object. "Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time. The generated positional information is sent to an entity 200 external to the input device 100. Examples of the external entity 200 include a host device, an application processor, a central processing unit (CPU), a special purpose processor, or other types of processors.

The processing system 110 is further configured to update the display panel 140 based on display data corresponding to an image to be displayed on the display panel 140. The display data may include graylevel values defined for respective subpixels of respective pixels. In various embodiments, a graylevel value for a subpixel correspond to desired brightness of the subpixel. The display data may be received from the entity 200. In other embodiments, the display data may be received from a different entity. The processing system 110 may include an IC chip configured as a touch display driver integrated (TDDI) circuit adapted to perform both display updating and capacitive sensing.

In one or more embodiments, the display panel 140 include sensor electrodes 142, display elements 144, source lines 146 (also referred to as data lines), multiplexers 148, gate lines 152 (also referred to as scan lines), and gate driver circuitry 154. The sensor electrodes 142 are used for capacitive sensing to detect an input object, e.g., the input object 130, in the sensing region 120 of the input device 100. While eight sensor electrodes 142 are illustrated, those skilled in the art would appreciate the display panel 140 may include more or less than eight sensor electrodes 142. Further, the sensor electrodes 142 may be disposed over the entirety of the sensing region 120 of the input device 100.

In one or more embodiments, the capacitive sensing is based on resulting signals acquired or received from the sensor electrodes 142. The capacitive sensing may be achieved through absolute capacitance sensing (or self-capacitance sensing) based on the absolute capacitances (or self-capacitances) of the sensor electrodes 142, the absolute capacitances being determined based on the resulting signals. The display panel 140 may further comprise transmitter electrodes that are not illustrated. In such embodiments, the capacitive sensing may be achieved through transcapacitance sensing (or mutual capacitance sensing) based on transcapacitances (or mutual capacitances) between the transmitter electrodes and the sensor electrodes 142, the transcapacitances being determined based on the resulting signals.

The sensor electrodes 142 may be also used for display updating. For example, in embodiments where the display panel 140 is configured as an LCD panel, the sensor electrodes 142 may be also used as common electrodes. In such embodiments, the common electrodes are driven with a common voltage $V_{COM}$ for updating the display panel 140.

The display elements 144 are configured to function as subpixels of respective pixels of the display panel 140. In one implementation, each display element 144 is disposed at an intersection of a corresponding source line 146 and gate line 152. In embodiments where an LCD panel is used as the display panel 140, the display elements 144 may each comprise a pixel electrode, a select transistor and a hold capacitor. In embodiments where an OLED display panel is alternatively used as the display panel 140, the display elements 144 may each comprise a light emitting element, a select transistor and a hold capacitor. The display panel 140 may include various interconnections other than the source lines 146 and the gate lines 152 depending on the configuration of the display elements 144.

The multiplexers 148 are configured to selectively connect the source lines 146 to the processing system 110 to achieve time-division driving. In the illustrated embodiment, each multiplexer 148 is coupled to three source lines 146 and connect a selected one of the three source lines 146 to the processing system 110. When a display element 144 is to be updated with an output voltage supplied from the processing system 110, a corresponding multiplexer 148 selects the source line 146 coupled to the display element 144 and connects the selected source line 146 to the processing system 110. The output voltage is provided to the display element 144 via the multiplexer 148 and the selected source line 146 to update the display element 144. In other embodiments, no multiplexers 148 are disposed in the display panel 140. In such embodiments, the source lines 146 may be directly connected to the processing system 110.

The gate driver circuitry 154 is configured to sequentially select the gate lines 152 and drive the selected gate line 152. The display elements 144 coupled to the selected gate line 152 are updated with output voltages received from the processing system 110.

In the illustrated embodiment, the processing system 110 includes display logic circuitry 112, a processor 114, a plurality of source driver circuits 116, and a plurality of capacitive sensing circuits 118. The display logic circuitry 112 is configured to deliver the display data received from the external entity 200 to the corresponding source driver circuits 116. The display logic circuitry 112 may be configured to process the display data and provide the processed display data to the corresponding source driver circuits 116. The source driver circuits 116 are each coupled to the display panel 140 via a corresponding source output terminal S, which is coupled to the corresponding multiplexer 148. In FIG. 2, two source output terminals, denoted by S1 and S2, are illustrated. The source driver circuits 116 are each configured to generate an output voltage corresponding to the display data received from the display logic circuitry 112 and update the corresponding display element 144 with the generated output voltage via the corresponding multiplexer 148 and the corresponding source line 146.

The capacitive sensing circuits 118 are each coupled to a corresponding sensor electrode 142 of the display panel 140 via a corresponding interface terminal RX. In FIG. 2, two interface terminals, denoted by RX1 and RX2, are illustrated. The capacitive sensing circuits 118 are each configured to receive a resulting signal from the corresponding sensor electrode 142 and generate a capacitive sensing output corresponding to the resulting signal. The capacitive sensing circuits 118 may be configured to apply filtering, baseline compensation, and/or other analog processing to the resulting signals to generate the capacitive sensing outputs. The processor 114 are configured to detect an input object in the sensing region 120 and generate positional information of the detected input object based on the capacitive sensing outputs received from the capacitive sensing circuits 118. The positional information may be indicative of the absolute position, relative position, velocity, acceleration, and other types of spatial information as discussed above. Examples of the processor 114 include a micro control unit (MCU), a central processing unit (CPU), a microcomputer, or other types of processors.

Figure 3:
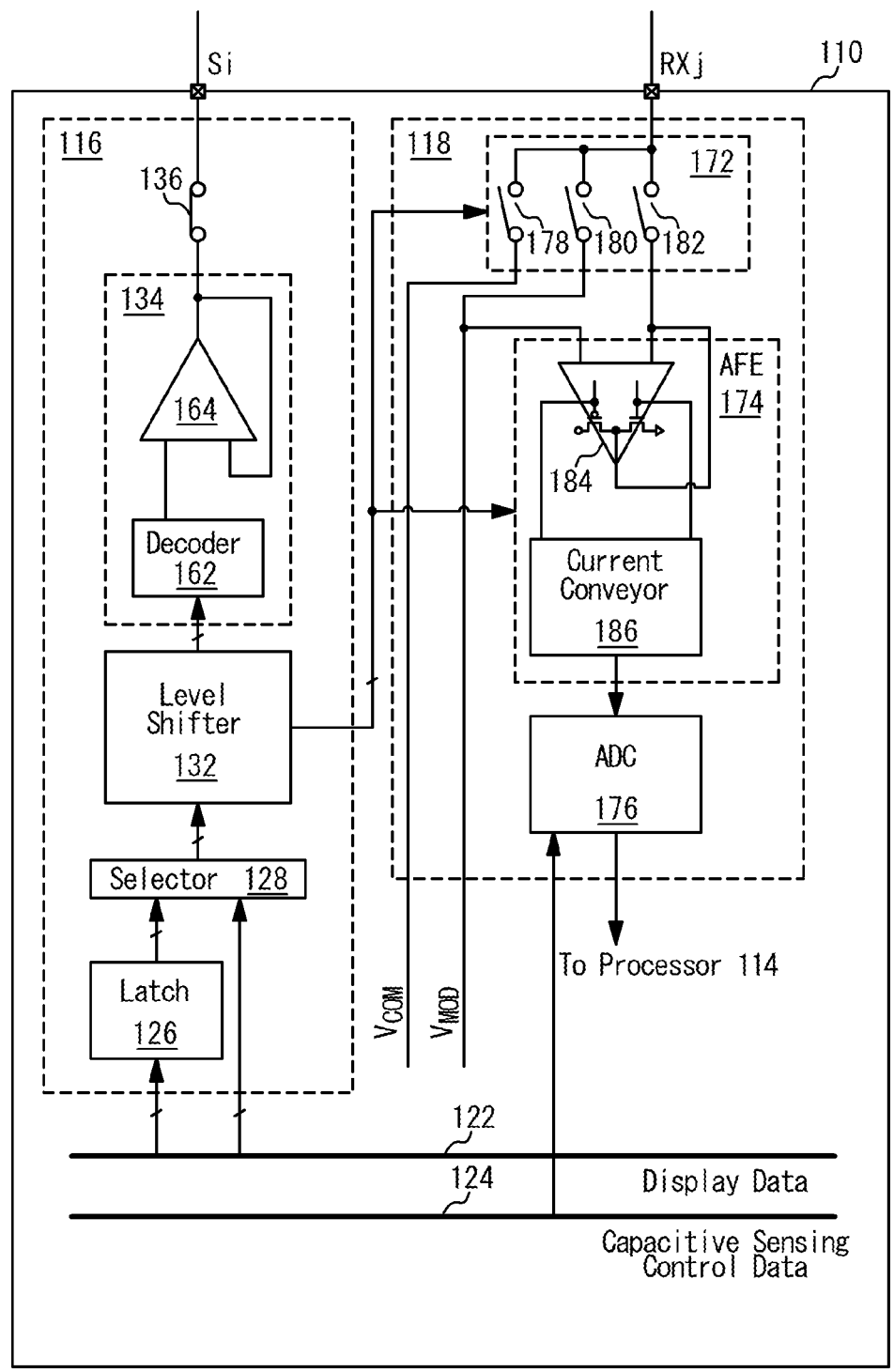
FIG. 3 illustrates a partial example configuration of a processing system, according to one or more embodiments.

FIG. 3 illustrates a partial example configuration of the processing system 110, according to one or more embodiments. While one source driver circuit 116 and one capacitive sensing circuit 118 are illustrated in FIG. 3, those skilled in the art would appreciate the processing system 110 may include two or more source driver circuits 116 and two or more capacitive sensing circuits 118. In the illustrated embodiment, the processing system 110 further includes a display data bus 122 and a capacitive sensing control bus 124. The display data bus 122 is configured to deliver the display data to the source driver circuits 116. The capacitive sensing control bus 124 is configured to deliver capacitive sensing control data that controls the capacitive sensing circuit 118. The capacitive sensing control data may include one or more analog setting parameters that specify one or more analog settings (e.g., the gain, the offset, the frequency response characteristics, the time gate window, or the like) for the capacitive sensing circuit 118. The capacitive sensing control data may additionally or alternatively include one or more switch setting parameters that specify states of switches disposed in the capacitive sensing circuit 118.

In the illustrated embodiment, the source driver circuit 116 corresponding to a source output terminal Si is configured to generate an output voltage for updating each display element 144 associated with the source output terminal Si, where i is a natural number. In one or more embodiments, the source driver circuit 116 includes a latch 126, a selector 128, a level shifter 132, a drive circuit 134, and an output switch 136.

The latch 126 is coupled to the display data bus 122 and configured to latch display data for a selected display element 144 associated with the source output terminal Si. The display data is transferred from the display logic circuitry 112 (illustrated in FIG. 2) over the display data bus 122. The display data may include the graylevel value associated with the selected display element 144. The latch 126 may be configured to operate in a voltage range from the circuit ground level (hereinafter referred to as GND) to the logic level (hereinafter referred to as VDD) of the display logic circuitry 112 of the processing system 110.

The selector 128 may be configured to select the display data held by the latch 126 or capacitive sensing control data received from the capacitive sensing control bus 124. The selector 128 may be configured to operate in the voltage range from the circuit ground level GND to the logic level VDD, similar to latch 126.

The level shifter 132 may be configured to provide level shifting (or voltage level translation) between the selector 128 and the drive circuit 134 and between the selector 128 and the capacitive sensing circuit 118. The level shifter 132 is configured to generate a first level-shifted output corresponding to the graylevel value included in the display data in response to the display data being selected by the selector 128. The first level-shifted output includes a digital signal indicative of the graylevel value and is provided to the drive circuit 134. The level shifter 132 is further configured to generate a second-level shifted output corresponding to the capacitive sensing control data in response to the capacitive sensing control data being selected by the selector 128. The second level-shifted output includes a digital signal indicative of the one or more analog setting parameters and/or the one or more switch setting parameters and is provided to the capacitive sensing circuit 118 to control the capacitive sensing circuit 118.

The drive circuit 134 is configured to generate the output voltage for the corresponding display element 144 based at least in part on the first level-shifted output received from the level shifter 132. In the illustrated embodiment, the drive circuit 134 includes a decoder 162 and an operational amplifier 164. The decoder 162 is configured to decode the first level-shifted output to generate an analog voltage corresponding to the first level-shifted output. In one implementation, the decoder 162 may include a digital-to-analog converter configured to perform a digital-to-analog conversion of the first level-shifted output. The analog voltage generated by the decoder 162 is provided to the operational amplifier 164. The operational amplifier 164 is configured to generate the output voltage for the corresponding display element 144 based on the analog voltage received from the decoder 162. The operational amplifier 164 may be configured as a voltage follower that provides an impedance conversion for the output voltage provided to the corresponding display element 144.

The output switch 136 is coupled between the source output terminal Si and the output of the operational amplifier 164. The output switch 136 is configured to connect and disconnect the output of the operational amplifier 164 to and from the source output terminal Si.

In the illustrated embodiment, the capacitive sensing circuit 118 corresponding to an interface terminal RXj includes a selector 172, an analog front end (AFE) 174, an analog-to-digital converter (ADC) 176. The selector 172 is configured to selectively connect the interface terminal RXj to selected one or more of the AFE 174, a Vcom line on which a common voltage Vcom is generated, and a $V_{MOD}$ line on which a modulated drive voltage $V_{MOD}$ is generated, where j is a natural number.

In embodiments where the display panel 140 is an LCD panel, the selector 172 may be configured to select the Vcom line to provide the common voltage Vcom to the sensor electrode 142 coupled to the interface terminal RXj during a display update period, allowing this sensor electrode 142 to function as a common electrode. In embodiments where absolute capacitive sensing is performed to detect an input object during a proximity sensing period, the selector 172 may be configured to connect the interface terminal RXj to the $V_{MOD}$ line and the AFE 174 to allow the AFE 174 to receive a resulting signal from the sensor electrode 142 coupled to the interface terminal RXj while modulating the sensor electrode 142 with the modulated drive voltage $V_{MOD}$. In embodiments where transcapacitance capacitive sensing is performed to detect an input object during a proximity sensing period, the selector 172 may be configured to connect the interface terminal RXj to the AFE 174 to allow the AFE 174 to receive the resulting signal from the sensor electrode 142 coupled to the interface terminal RXj while a transmitter signal is provided to a transmitter electrode (not shown) capacitively coupled to the sensor electrode 142 (also see FIG. 2).

In the illustrated embodiment, the selector 172 includes a switch 178 coupled between the interface terminal RXj and the Vcom line, a switch 180 coupled between the interface terminal RXj and the $V_{MOD}$ line, and a switch 182 coupled between the interface terminal RXj and the AFE 174. The capacitive sensing circuit 118 may omit the switch 178 and the Vcom line, for example, in embodiments where the display panel 140 does not use the common voltage Vcom (e.g., an OLED display panel.) The selector 172 may be further configured to connect the interface terminal RXj to another line on which a voltage provided to the corresponding sensor electrode 142 (e.g., a different modulated voltage and a constant bias voltage) is generated.

The AFE 174 is configured to receive a resulting signal from the sensor electrode 142 coupled to the interface terminal RXj and generate a current output based on the resulting signal. In one implementation, the resulting signal may be generated as a current signal, and the AFE 174 may be configured to generate the current output such that the current output has a current level corresponding to (e.g., proportional to) the current level of the resulting signal. The AFE 174 may be further configured to apply filtering, baseline compensation, and/or other analog processing to the resulting signal. In the illustrated embodiment, the AFE 174 includes a buffer amplifier 184 and a current conveyer 186. The buffer amplifier 184 is configured to receive the resulting signal from the sensor electrode 142, and the current conveyer 186 is configured to generate a current signal corresponding to the current level of the resulting signal based on differential outputs of the buffer amplifier 184. The AFE 174 may additionally include one or more analog processing circuits configured to condition the resulting signal and/or the differential current signals (e.g., filtering, baselining or the like.)

The ADC 176 is configured to apply an analog-to-digital conversion to the current signal received from the current conveyer 186 to generate a capacitive sensing output. The capacitive sensing output generated by the ADC 176 of each capacitive sensing circuit 118 is sent to the processor 114. The processor 114 is configured to generate the positional information based on the capacitive sensing outputs received from the respective capacitive sensing circuits 118.

The capacitive sensing circuit 118 is configured to generate the capacitive sensing output based at least in part on the second level-shifted output received from the level shifter 132. In various implementations, the second level-shifted output is generated based on the capacitive sensing control data and the capacitive sensing circuit 118 is configured to operate under control of the capacitive sensing control data.

In some embodiments, the capacitive sensing control data may include switch setting parameters that indicate states (e.g., the on state and the off state) of the switches 178, 180, and 182 disposed in the selector 172. In such embodiments, the second level-shifted output generated by the level shifter 132 may include control signals that control the states of the switches 178, 180, and 182 as indicated by the switch setting parameters.

Additionally, or alternatively, the capacitive sensing control data may include one or more analog setting parameters that indicate analog settings (e.g., the gain, the offset, the frequency response characteristics, the time gate window, or the like) of the AFE 174. In such embodiments, the second level-shifted output generated by the level shifter 132 may include control signals that control the AFE 174 as indicated by the analog setting parameters. In one implementation, the analog setting parameters may indicate one or more settings (e.g., the gain, the offset, the time gate window or the like) of the buffer amplifier 184, and the second level-shifted output generated by the level shifter 132 may include control signals that controls the settings of the buffer amplifier 184. Additionally, or alternatively, the analog setting parameters may indicate one or more settings (e.g., the gain, the offset, the time gate window or the like) of the current conveyer 186, and the second level-shifted output generated by the level shifter 132 may include control signals that control the settings of the current conveyer 186.

The capacitive sensing control data may additionally include ADC setting parameters that indicate settings (e.g., the sampling timing, the time gate window, and so forth) of the ADC 176. The ADC 176 may be configured to receive the ADC setting parameters from the capacitive sensing control bus 124 and operate as indicated by the ADC setting parameters.

In the embodiment illustrated in FIG. 3, the level shifter 132 is used for controlling both the drive circuit 134 and the capacitive sensing circuit 118. Such usage of the level shifter 132 may effectively reduce the silicon area of the processing system 110.

Figure 4:
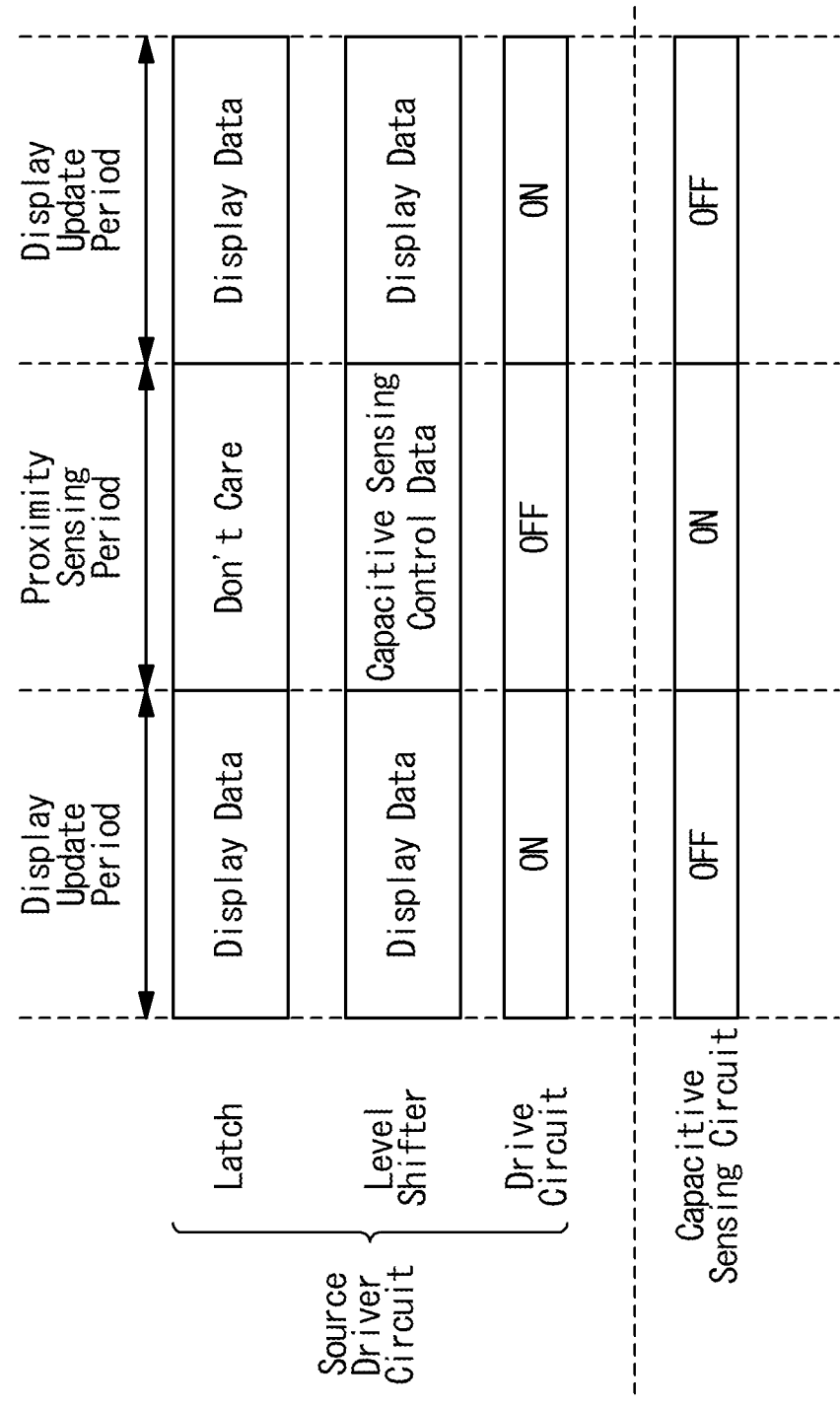
FIG. 4 illustrates an example operation of a source driver circuit and capacitive sensing circuit, according to one or more embodiments.

FIG. 4 illustrates an example operation of the source driver circuits 116 and the capacitive sensing circuits 118, according to one or more embodiments. In the illustrated embodiment, the operation includes updating one or more display elements 144 during a display update period and acquiring resulting signals from the sensor electrodes 142 during a proximity sensing period (also see FIGS. 2 and 3). The proximity sensing period may be disposed between adjacent display update periods. The proximity sensing period may be disposed in a blanking period (e.g., a back porch period of a blanking period). During the display update period, the latch 126 of each source driver circuit 116 latches and holds the display data from the display data bus 122. The selector 128 selects the display data held by the latch 126, and the level shifter 132 generates the first level-shifted output based on the display data. The drive circuit 134 generates the output voltage to be provided to the corresponding display element 144 based on the first level-shifted output received from the level shifter 132 to update the corresponding display element 144. The capacitive sensing circuit 118 may be disabled during the display update period.

During the proximity sensing period, the selector 128 of each source driver circuit 116 selects the capacitive sensing control data received from the capacitive sensing control bus 124, and the level shifter 132 generates the second level-shifted output based on the capacitive sensing control data. The capacitive sensing circuit 118 generates the capacitive sensing output corresponding to the resulting signal acquired from the corresponding sensor electrode 142 under control of the second level-shifted output received from the level shifter 132. In one implementation, the drive circuit 134 may be disabled during the proximity sensing period. In such embodiments, the data held by the latch 126 does not matter during the proximity sensing period, as indicated as "Don't Care" in FIG. 4.

Figure 5:
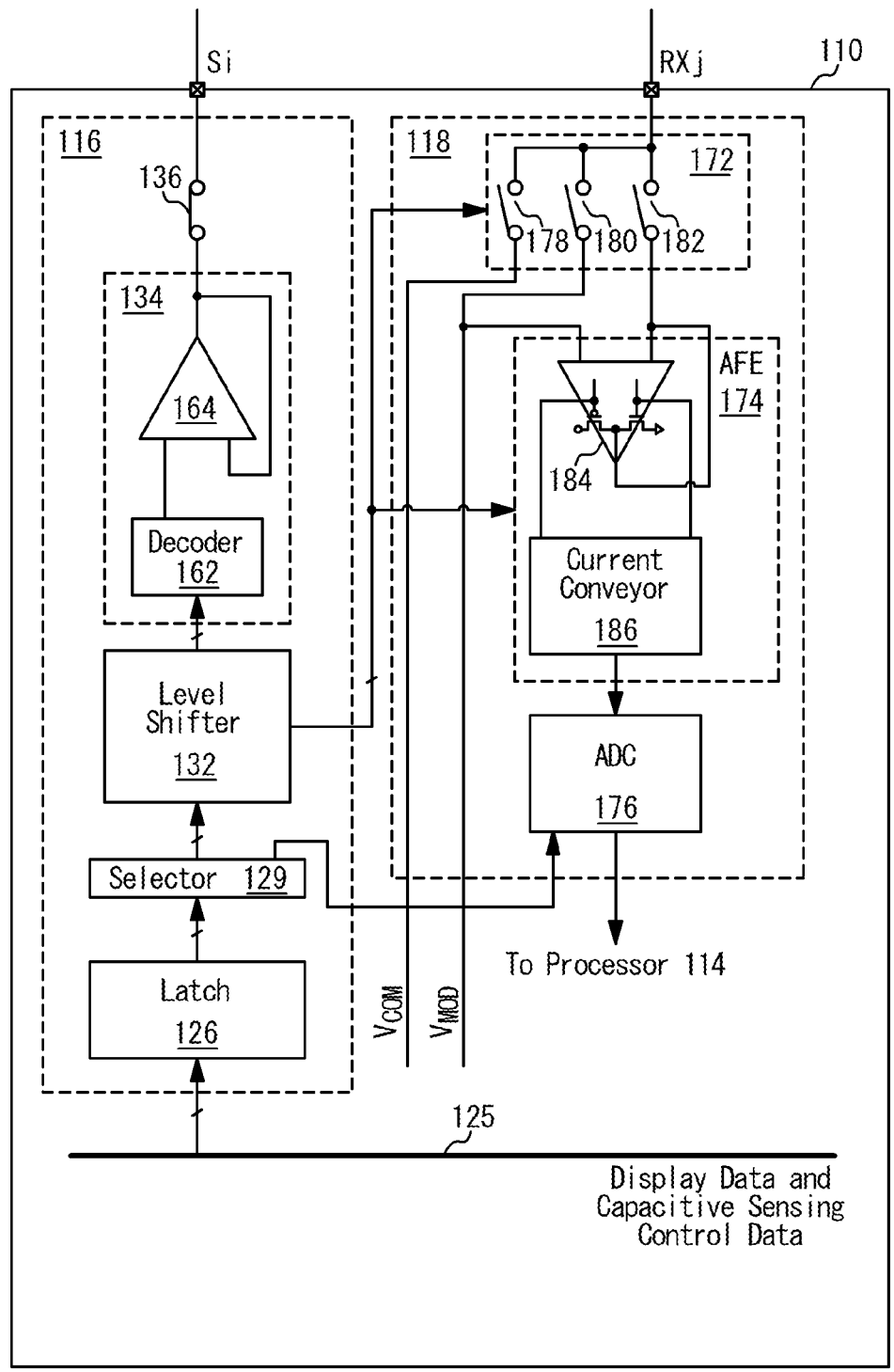
FIG. 5 illustrates a partial example configuration of a processing system, according to one or more embodiments.

FIG. 5 illustrates a partial example configuration of the processing system 110, according to other embodiments. In the illustrated embodiment, the processing system 110 includes a common bus 125 configured to deliver both the display data and the capacitive sensing control data to each source driver circuit 116. The latch 126 of each source driver circuit 116 is configured to latch the display data during a display update period and the capacitive sensing control data during a capacitive sensing period. Each source driver circuit 116 includes a selector 129 configured to forward selected part of the data held by the latch 126 to the level shifter 132. The selector 129 may be configured to forward the display data to the level shifter 132 during the display update period. The selector 129 may be further configured to forward part of the capacitive sensing control data other than ADC setting parameters during the proximity sensing period while forwarding the ADC setting parameters to the ADC 176.

Figure 6:
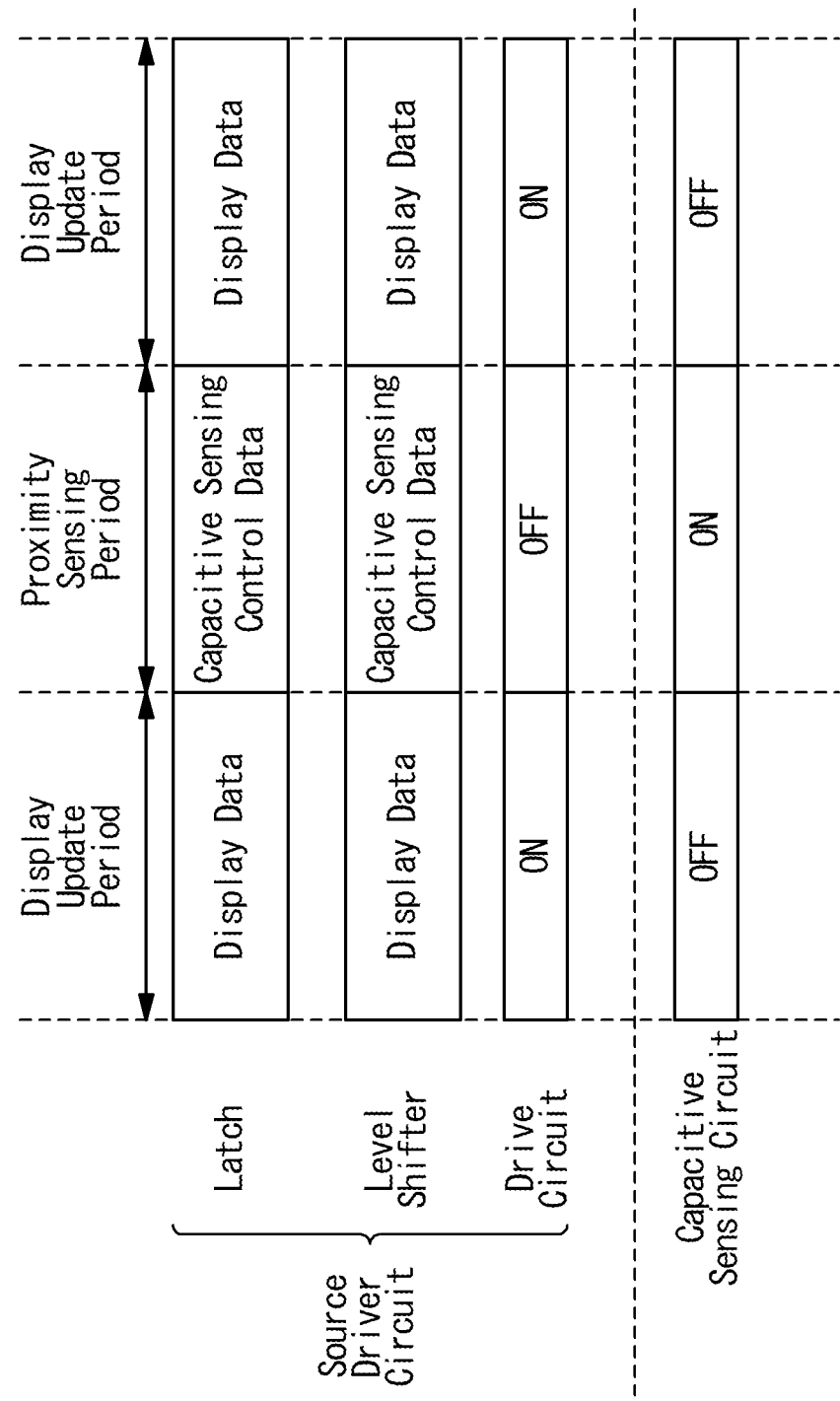
FIG. 6 illustrates an example operation of a source driver circuit and a capacitive sensing circuit, according to one or more embodiments.

FIG. 6 illustrates an example operation of the source driver circuit 116 and the capacitive sensing circuit 118 illustrated in FIG. 5, according to one or more embodiments. During the display update period, the latch 126 of each source driver circuit 116 latches and holds the display data from the common bus 125. The selector 129 forwards the display data from the latch 126 to the level shifter 132, and the level shifter 132 generates the first level-shifted output based on the display data. The drive circuit 134 generates the output voltage to be provided to the corresponding display element 144 based on the first level-shifted output received from the level shifter 132 to update the corresponding display element 144. The capacitive sensing circuit 118 may be disabled during the display update period.

During the proximity sensing period, the latch 126 of each source driver circuit 116 latches and holds the capacitive sensing control data from the common bus 125. The selector 129 forwards part of the capacitive sensing control data other than the ADC setting parameters to the level shifter 132 and forwards the ADC setting parameters to the ADC 176. The level shifter 132 generates the second level-shifted output based on the forwarded part of the capacitive sensing control data. The ADC 176 is controlled based on the ADC setting parameters. The capacitive sensing circuit 118 generates the capacitive sensing output corresponding to the resulting signal acquired from the corresponding sensor electrode 142 under control of the second level-shifted output received from the level shifter 132. In one implementation, the drive circuit 134 may be disabled during the proximity sensing period.

Figure 7:
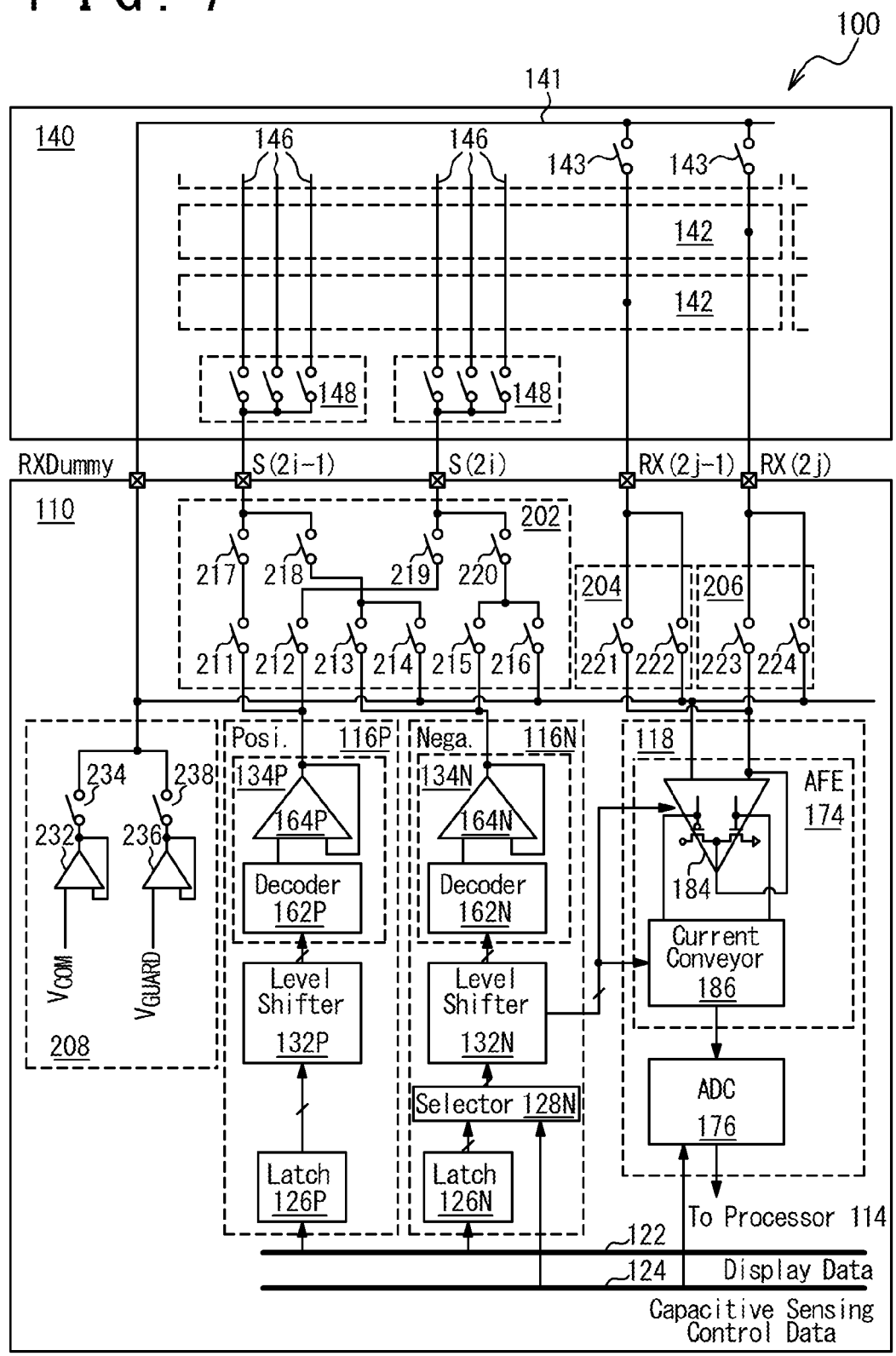
FIG. 7 illustrates a partial example configuration of a processing system, according to one or more embodiments.

FIG. 7 illustrates a partial example configuration of the processing system 110, according to other embodiments. In the illustrated embodiment, adjacent two source driver circuits 116 are paired, one of which is configured to generate a positive output voltage and the other is configured to generate a negative output voltage. A source driver circuit 116 configured to generate a positive output voltage may be hereinafter referred to as positive source driver circuit 116P and a source driver circuit 116 configured to generate a negative output voltage may be hereinafter referred to as negative source driver circuit 116N. While FIG. 7 illustrates one positive source driver circuit 116P and one negative source driver circuit 116N, those skilled in the art would appreciate that the processing system 110 may include two or more positive source driver circuits 116P and two or more negative source driver circuits 116N.

The positive source driver circuit 116P is configured to operate on a positive analog power supply voltage having a positive voltage level of VSP higher than the logic level VDD. The positive voltage level of the positive analog power supply voltage may be hereinafter referred to as positive analog power supply level VSP. Similarly, the negative source driver circuit 116N is configured to operate on a negative analog power supply voltage having a negative voltage level of VSN. The negative voltage level of the negative analog power supply voltage may be hereinafter referred to as negative analog power supply level VSN. Additionally, at least part of the capacitive sensing circuit 118 is also configured to operate on the negative analog power supply voltage of VSN. In the illustrated embodiment, the AFE 174 of the capacitive sensing circuit 118, which includes the buffer amplifier 184 and the current conveyer 186, is configured to operate on the negative analog power supply voltage of VSN.

Each positive source driver circuit 116P includes a latch 126P, a level shifter 132P, and a drive circuit 134P. The latch 126P is coupled to the display data bus 122 and configured to latch display data transferred over the display data bus 122. The latch 126P is configured to operate in the voltage range from the circuit ground level GND to the logic level VDD. The level shifter 132P is configured to provide level shifting between the latch 126P and the drive circuit 134P, whereas the drive circuit 134P is configured to operate in the voltage range from the circuit ground level GND to the positive analog power supply level VSP in order to output a positive output voltage in the voltage range from GND to VSP for a corresponding display element 144. The level shifter 132P is configured to provide a level-shifted output in the voltage range from GND to VSP to the drive circuit 134P, and the drive circuit 134P is configured to generate the positive output voltage based on the level-shifted output received from the level shifter 132P. In the illustrated embodiment, the drive circuit 134P includes a decoder 162P and an operational amplifier 164P. The decoder 162P is configured to decode the level-shifted output from the level shifter 132P to generate a positive analog voltage corresponding to the level-shifted output. In one implementation, the decoder 162P may include a digital-to-analog converter configured to perform a digital-to-analog conversion of the level-shifted output. The positive analog voltage generated by the decoder 162P is provided to the operational amplifier 164P. The operational amplifier 164P is configured to generate the positive output voltage for the corresponding display element 144 based on the analog voltage received from the decoder 162P. The operational amplifier 164P may be configured as a voltage follower that provides an impedance conversion for the positive output voltage.

Each negative source driver circuit 116N, which is configured similarly to the source driver circuit 116 illustrated in FIG. 3, includes a latch 126N, a selector 128N, a level shifter 132N, and a drive circuit 134N. In the illustrated embodiment, the latch 126N is coupled to the display data bus 122 and configured to latch display data over the display data bus 122. The selector 128N is configured to select the display data held by the latch 126N or capacitive sensing control data received from the capacitive sensing control bus 124. The input and output voltage levels of the selector 128N is equal to the logic level of the logic circuitry of the processing system 110. The latch 126N and the selector 128N are configured to operate in the voltage range from the circuit ground level GND to the logic level VDD, while the drive circuit 134N is configured to operate in the negative voltage range from the negative analog power supply level VSN to the circuit ground level GND.

Figure 8:
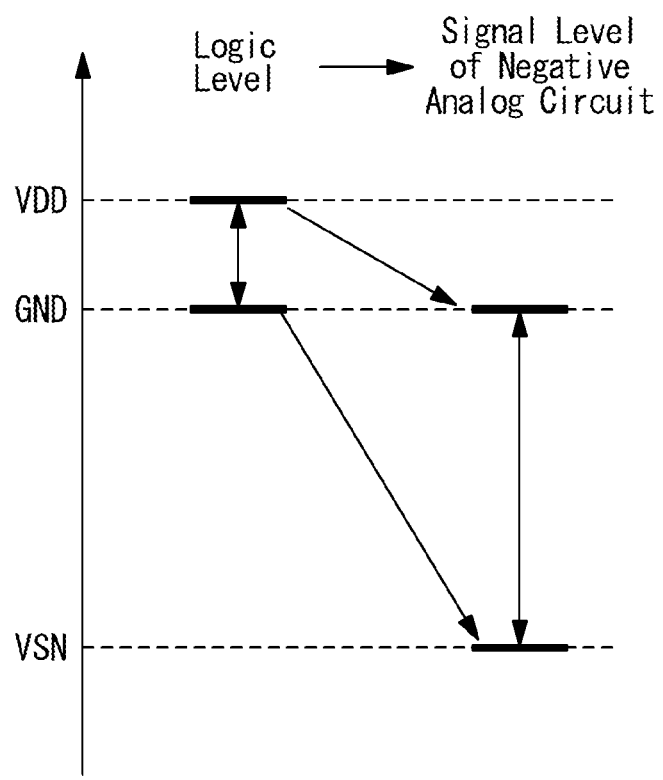
FIG. 8 illustrates exemplary level shifting provided by a level shifter, according to one or more embodiments.

The level shifter 132N is configured to provide level shifting between the selector 128N and the drive circuit 134N and between the selector 128N and the capacitive sensing circuit 118. FIG. 8 illustrates exemplary level shifting provided by the level shifter 132N, according to one or more embodiments. In one implementation, the latch 126N and the selector 128N are configured to operate in the voltage range from the circuit ground level GND and the logic level VDD, while the drive circuit 134N and at least part of the capacitive sensing circuit 118 (e.g., the AFE 174) are configured to operate in the voltage range from the negative analog power supply level VSN to the circuit ground level GND.

Referring back to FIG. 7, the level shifter 132N is configured to generate a first level-shifted output corresponding to the graylevel value included in the display data in response to the display data being selected by the selector 128N. The first level-shifted output has a voltage level in the voltage range from VSN to GND and is provided to the drive circuit 134N. The level shifter 132N is further configured to generate a second-level shifted output corresponding to the capacitive sensing control data in response to the capacitive sensing control data being selected by the selector 128N. The second level-shifted output also has a voltage level in the voltage range from VSN to GND and is provided to the capacitive sensing circuit 118 to control the capacitive sensing circuit 118. In one implementation, the capacitive sensing control data may include analog setting parameters that controls the AFE 174, and the AFE 174 may be configured to operate in response to the second level-shifted output as indicated by the analog setting parameters. The use of the level shifter 132N for controlling both the drive circuit 134N and the capacitive sensing circuit 118 may effectively reduce the silicon area of the processing system 110 and reduce the manufacturing cost as a level shifter configured to output a negative level-shifted output often occupies an increased silicon area.

The drive circuit 134N is configured to generate a negative output voltage for the corresponding display element 144 based on the first level-shifted output received from the level shifter 132N. In the illustrated embodiment, the drive circuit 134N includes a decoder 162N and an operational amplifier 164N. The decoder 162N is configured to decode the first level-shifted output to generate a negative analog voltage corresponding to the first level-shifted output. In one implementation, the decoder 162N may include a digital-to-analog converter configured to perform a digital-to-analog conversion of the first level-shifted output. The negative analog voltage generated by the decoder 162N is provided to the operational amplifier 164N. The operational amplifier 164N is configured to generate the negative output voltage for the corresponding display element 144 based on the negative analog voltage received from the decoder 162N. The operational amplifier 164N may be configured as a voltage follower that provides an impedance conversion for the negative output voltage.

In the illustrated embodiment, the processing system 110 further includes a source multiplexer 202 configured to switch connections between the pair of the positive source driver circuit 116P and the negative source driver circuit 116N and its corresponding source output terminals S(2i-1) and S(2i). The source multiplexer 202 may be further configured to switch connections between the source output terminals S(2i-1) and S(2i) and the voltage supply circuitry 208. In the illustrated embodiment, the source multiplexer 202 includes switches 211 to 220. The switches 211 to 216 may be configured as metal-oxide semiconductor (MOS) transistor switches, while the switches 217 to 220 may be configured as well switches. The switches 217 and 218 are coupled to the source output terminal S(2i-1) and the switches 219 and 220 are coupled to the source output terminal S(2i). The switch 211 is coupled between the switch 217 and the positive source driver circuit 116P, and the switch 212 is coupled between the switch 219 and the positive source driver circuit 116P. The switch 213 is coupled between the switch 218 and the negative source driver circuit 116N, and the switch 214 is coupled between the switch 218 and the voltage supply circuitry 208. The switch 215 is coupled between the switch 220 and the negative source driver circuit 116N, and the switch 216 is coupled between the switch 220 and the voltage supply circuitry 208.

The processing system 110 may be configured to process resulting signal received from a plurality of sensor electrodes 142 with one capacitive sensing circuit 118. In the illustrated embodiment, the capacitive sensing circuit 118 is configured to process resulting signals received from two sensor electrodes 142 coupled to interface terminals RX(2j-1) and RX(2j), respectively. While FIG. 7 illustrates one capacitive sensing circuit 118, those skilled in the art would appreciate that the processing system 110 may include two or more capacitive sensing circuits 118.

In the illustrated embodiment, the processing system 110 includes proximity sensing multiplexer 204 and 206. The proximity sensing multiplexer 204 is configured to connect the interface terminal RX(2j-1) to a selected one of the capacitive sensing circuit 118 and the voltage supply circuitry 208. The proximity sensing multiplexer 204 includes switches 221 and 222. The switch 221 is coupled between the interface terminal RX(2j-1) and the capacitive sensing circuit 118, and the switch 222 is coupled between the interface terminal RX(2j-1) and the voltage supply circuitry 208. The proximity sensing multiplexer 206 is configured to connect the interface terminal RX(2j) to a selected one of the capacitive sensing circuit 118 and the voltage supply circuitry 208. In the illustrated embodiment, the proximity sensing multiplexer 206 includes switches 223 and 224. The switch 223 is coupled between the interface terminal RX(2j) and the capacitive sensing circuit 118, and the switch 224 is coupled between the interface terminal RX(2j) and the voltage supply circuitry 208.

The processing system 110 may further include a voltage supply circuitry 208 configured to selectively output the common voltage Vcom and a guard voltage $V_{GUARD}$. In one implementation, the guard voltage $V_{GUARD}$ may be a fixed voltage to be supplied to electrodes located near a sensor electrode 142 from which a resulting signal is to be acquired. The electrodes supplied with the guard voltage $V_{GUARD}$ may include source lines 146, sensor electrodes 142 from which resulting signals are not acquired, or other electrodes disposed in the display panel 140. In one implementation, the voltage supply circuitry 208 may include a common voltage regulator 232, a switch 234, a guard voltage regulator 236, and a switch 238. The common voltage regulator 232 is configured to generate the common voltage Vcom. The switch 234 is configured to connect or disconnect the common voltage regulator 232 to and from the output of the voltage supply circuitry 208. The guard voltage regulator 236 is configured to generate the guard voltage $V_{GUARD}$. The switch 238 is configured to connect or disconnect the guard voltage regulator 236 to and from the output of the voltage supply circuitry 208.

The processing system 110 may be further configured to selectively output the common voltage Vcom and the guard voltage $V_{GUARD}$ to the display panel 140 via an external output terminal RXDummy In such embodiments, the display panel 140 may further include a voltage supply line 141 and switches 143, where the voltage supply line 141 may be coupled to the external output terminal RXDummy, and the switches 143 may be coupled between the voltage supply line 141 and the sensor electrodes 142, respectively. The voltage supply line 141 and the switches 143 may be used to provide the common voltage Vcom and the guard voltage $V_{GUARD}$ to the sensor electrodes 142.

Figure 9:
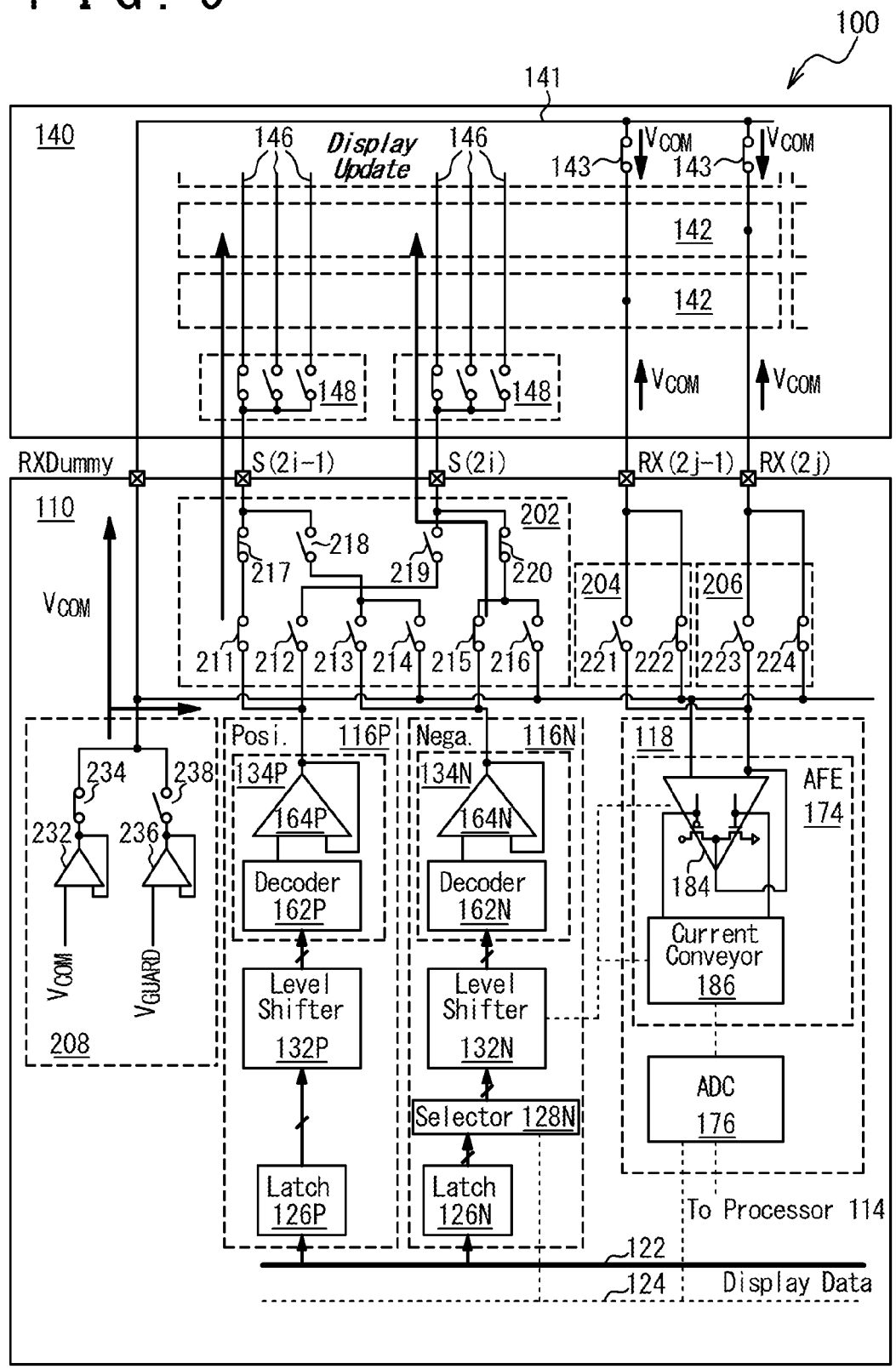
FIG. 9 illustrates an example operation of an input device in updating selected display elements during a display update period, according to one or more embodiments.

FIG. 9 illustrates an example operation of the input device 100 illustrated in

FIG. 7 in updating a first selected one of the display elements 144 associated with the source output terminal S(2i-1) and a second selected one of the display elements 144 associated with the source output terminal S(2i) during a display update period, according to one or more embodiments. During the display update period, the positive source driver circuit 116P generates a positive output voltage for the first selected display elements 144, and the negative source driver circuit 116N generates a negative output voltage for the second selected display element 144. More specifically, the latch 126P latches display data for the first selected display element 144, and the level shifter 132P outputs a level-shifted output corresponding to the display data held by the latch 126P. The drive circuit 134P generates the positive output voltage based on the level-shifted output from the level shifter 132P. The latch 126N latches display data for the second selected display element 144, and the selector 128N selects the display data held by the latch 126N. The level shifter 132N outputs a first level-shifted output corresponding to the display data held by the latch 126N. The drive circuit 134N generates the negative output voltage based on the first level-shifted output from the level shifter 132N. The source multiplexer 202 connects the positive source driver circuit 116P to the source output terminal S(2i-1) and the negative source driver circuit 116N to the source output terminal S(2i). The positive output voltage is output from the source output terminal S(2i-1) and provided to the first selected display element 144 via the corresponding multiplexer 148 and source line 146 to update the first selected display element 144 with the positive output voltage. The negative output voltage is output from the source output terminal S(2i) and provided to the second selected display element 144 to update the second selected display element 144 with the negative output voltage.

The voltage supply circuitry 208 provides the common voltage Vcom to the sensor electrodes 142 during the display update period. More specifically, the voltage supply circuitry 208 outputs the common voltage Vcom with the switch 234 turned on. The proximity sensing multiplexers 204 and 206 establish electrical connections between the voltage supply circuitry 208 and the sensor electrodes 142 coupled to interface terminals RX(2j-1) and RX(2j), and the switches 143 disposed in the display panel 140 also establish electrical connections between the voltage supply circuitry 208 and the sensor electrodes 142. As a result, the common voltage Vcom is provided to the sensor electrodes 142, allowing the sensor electrodes 142 to function as common electrodes.

During a second display update period, the negative source driver circuit 116N may generate a negative output voltage for a third selected one of the display elements 144 associated with the source output terminal S(2i-1), and the positive source driver circuit 116P may generate a positive output voltage for a fourth selected one of the display elements 144 associated with the source output terminal S(2i). In such implementations, during the second display update period, the source multiplexer 202 may connect the negative source driver circuit 116N to the source output terminal S(2i-1) and the positive source driver circuit 116P to the source output terminal S(2i). The negative output voltage may be output from the source output terminal S(2i-1) and provided to the third selected display element 144 to update the third selected display element 144 with the negative output voltage. The positive output voltage may be output from the source output terminal S(2i) and provided to the fourth selected display element 144 to update the fourth selected display element 144 with the positive output voltage.

Figure 10:
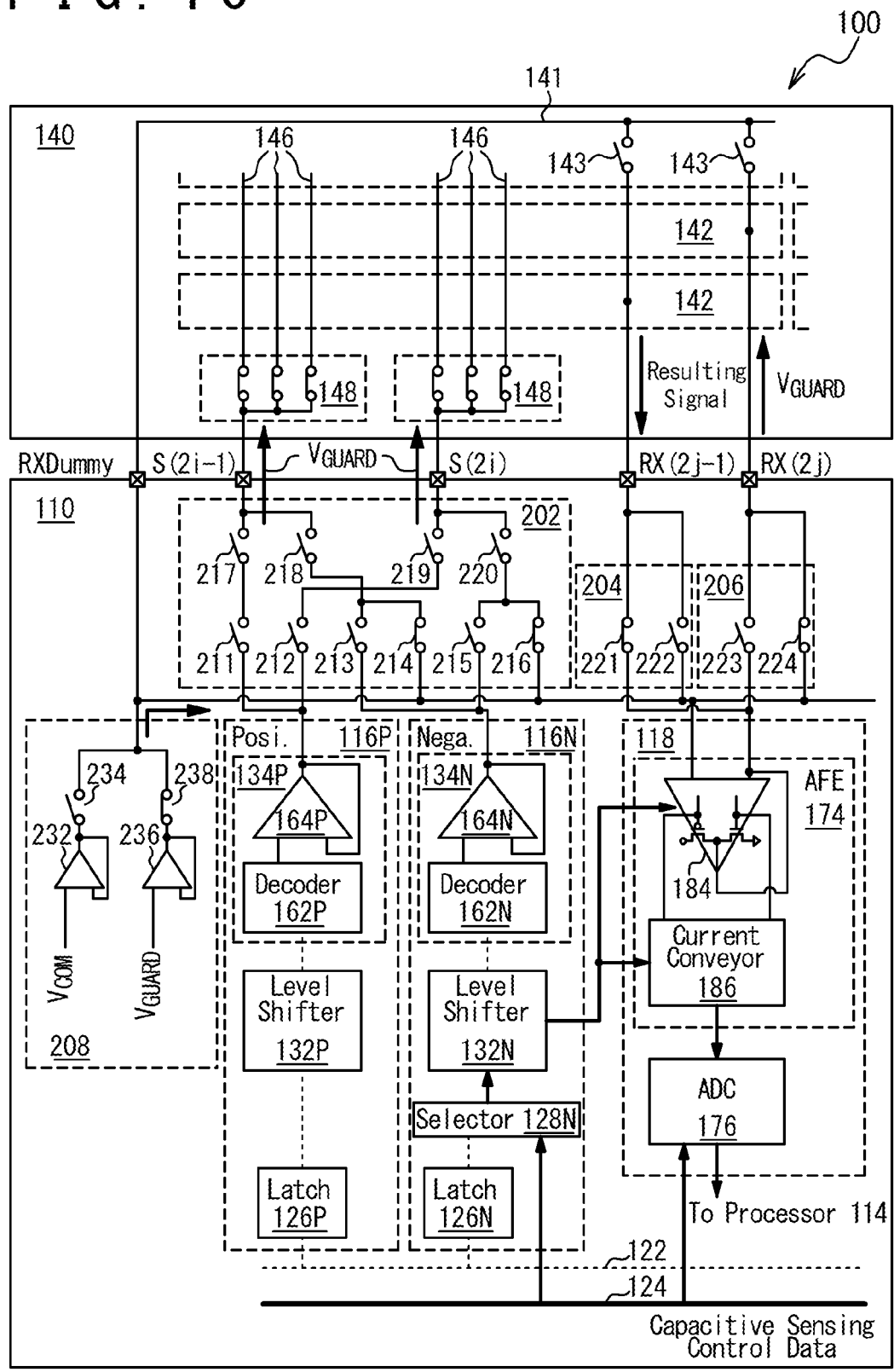
FIG. 10 illustrates an example operation of an input device in generating a capacitive sensing output for a sensor electrode during a proximity sensing period, according to one or more embodiments.

FIG. 10 illustrates an example operation of the input device 100 illustrated in FIG. 7 in generating a capacitive sensing output for the sensor electrode 142 coupled to the interface terminal RX(2j-1) during a proximity sensing period, according to one or more embodiments. In the illustrated embodiment, the proximity sensing multiplexer 204 electrically connects the interface terminal RX(2j-1) to the capacitive sensing circuit 118 to allow the capacitive sensing circuit 118 to receive a resulting signal from the sensor electrode 142 coupled to the interface terminal RX(2j-1). The capacitive sensing circuit 118 generates the capacitive sensing output based on the received resulting signal. Meanwhile, the guard voltage $V_{GUARD}$ is output from the voltage supply circuitry 208 and deliver to the sensor electrode 142 coupled to the interface terminal RX(2j). In some implementations, during the proximity sensing period, the guard voltage $V_{GUARD}$ may be further delivered to the source lines 146 via the source multiplexer 202 and the multiplexers 148 coupled to the source output terminals S(2i-1) and S(2i). The drive circuits 134P and 134N may be disabled during the proximity sensing period.

During the proximity sensing period, the capacitive sensing circuit 118 is controlled by a second level-shifted output received from the level shifter 132N. More specifically, the selector 128N selects the capacitive sensing control data received from the capacitive sensing control bus 124, and the level shifter 132N generates the second level-shifted output based on the capacitive sensing control data. The capacitive sensing circuit 118 generates the capacitive sensing output corresponding to the resulting signal acquired from the sensor electrode 142 coupled to the interface terminal RX(2j-1) under control of the second level-shifted output received from the level shifter 132N. The capacitive sensing control data may include one or more analog setting parameters that indicate analog settings (e.g., the gain, the offset, the frequency response characteristics, the time gate window, or the like) of the AFE 174 of the capacitive sensing circuit 118. In such embodiments, the second level-shifted output generated by the level shifter 132N may include control signals that control the AFE 174 as indicated by the analog setting parameters. In one implementation, the analog setting parameters may indicate one or more settings (e.g., the gain, the offset, the time gate window or the like) of the buffer amplifier 184, and the second level-shifted output generated by the level shifter 132N may include control signals that controls the settings of the buffer amplifier 184. Additionally, or alternatively, the analog setting parameters may indicate one or more settings (e.g., the gain, the offset, the time gate window or the like) of the current conveyer 186, and the second level-shifted output generated by the level shifter 132N may include control signals that controls the settings of the current conveyer 186.

The capacitive sensing output for the sensor electrode 142 coupled to the interface terminal RX(2j) may be generated in a similar manner to that for the sensor electrode 142 coupled to the interface terminal RX(2j-1). During the generation of the capacitive sensing output for the sensor electrode 142 coupled to the interface terminal RX(2j), the sensor electrode 142 coupled to the interface terminal RX(2j) is coupled to the capacitive sensing circuit 118 and the guard voltage is provided to the sensor electrode 142 coupled to the interface terminal RX(2j-1).

Figure 11:
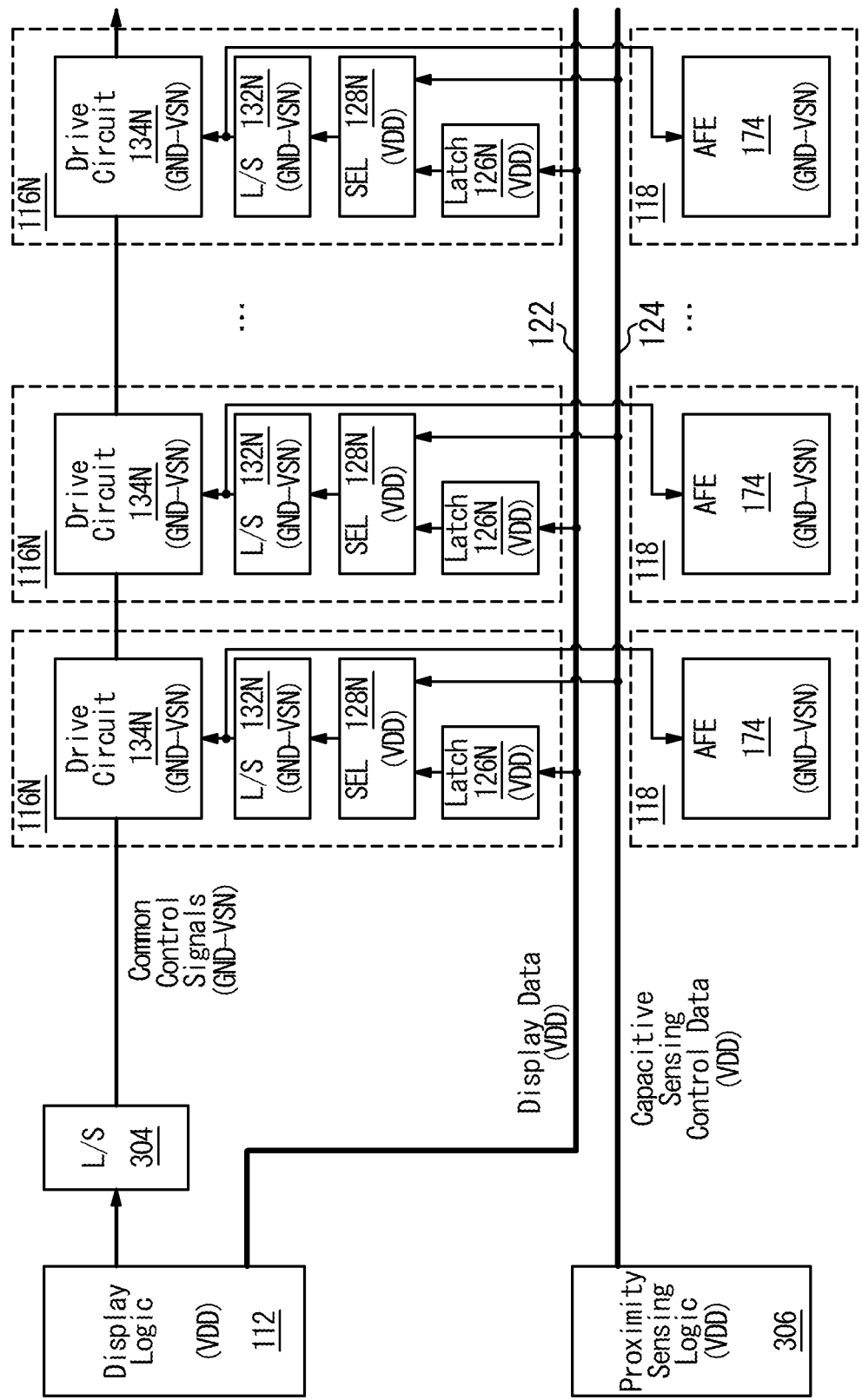
FIG. 11 illustrates an example delivery of display data and capacitive sensing control data together with example voltage ranges used to operate components integrated in negative source driver circuits and the capacitive sensing circuits, according to one or more embodiments.

FIG. 11 illustrates an example delivery of display data and capacitive sensing control data to the negative source driver circuits 116N together with voltage ranges used to operate components integrated in negative source driver circuits 116N and the capacitive sensing circuits 118, according to one or more embodiments. In the illustrated embodiment, display logic circuitry 112 is configured to deliver display data to the negative source driver circuits 116N via the display data bus 122, and proximity sensing logic circuitry 306 is configured to generate and deliver capacitive sensing control data to the capacitive sensing circuits 118 via the capacitive sensing control bus 124.

In the illustrated embodiments, the display logic circuitry 112, the latches 126N and the selectors (SEL) 128N of the negative source driver circuits 116N, and the proximity sensing logic circuitry 306 are configured to operate in the voltage range from the circuit ground level GND to the logic level VDD, while the drive circuits 134N of the negative source driver circuits 116N and the AFEs 174 of the capacitive sensing circuits 118 are configured to operate in the voltage range from the negative analog power supply level VSN to the circuit ground level GND. The level shifters (L/S) 132N are configured to provide level-shifting (or voltage level translation) to address the difference in the voltage range.

During a display update period, the display data are transferred from the display logic circuitry 112 to the latches 126N over the display data bus 122 with signals of the voltage range from the circuit ground level GND to the logic level VDD. The level shifters 132N are configured to generate, based on the display data received from the latches 126N, first level-shifted outputs that have voltage levels in the voltage range from the negative analog power supply level VSN to the circuit ground level GND. The drive circuits 134N are configured to generate output voltages based on the first level-shifted outputs. The output voltages are provided to corresponding display elements 144 to update the same.

During a proximity sensing period, the capacitive sensing control data are transferred from the proximity sensing logic circuitry 306 to the selectors 128N over the capacitive sensing control bus 124 with signals of the voltage range from the circuit ground level GND to the logic level VDD. The level shifters 132N are further configured to generate, based on the capacitive sensing control data received from the capacitive sensing control bus 124 via the selectors 128N, second level-shifted outputs that have voltage levels in the voltage range from the negative analog power supply level VSN to the circuit ground level GND. The AFEs 174 are configured to generate current outputs corresponding to resulting signals acquired from corresponding sensor electrodes 142 under control of the second level-shifted outputs. The generated current outputs are provided to ADCs 176 (illustrated in FIG. 7) to generate capacitive sensing outputs.

The display logic circuitry 112 may be further configured to control the drive circuits 134N. In such implementations, the display logic circuitry 112 may be configured to generate and provide common control signals to the drive circuits 134N via a level shifter 304 configured to provide level-shifting (or voltage level translation). The display logic circuitry 112 may be configured to generate the common control signals in the voltage range from the circuit ground level GND to the logic level VDD, while the common control signals output from the level shifter 304 have voltage levels in the voltage range from the negative analog power supply level VSN to the circuit ground level GND.

Figure 12:
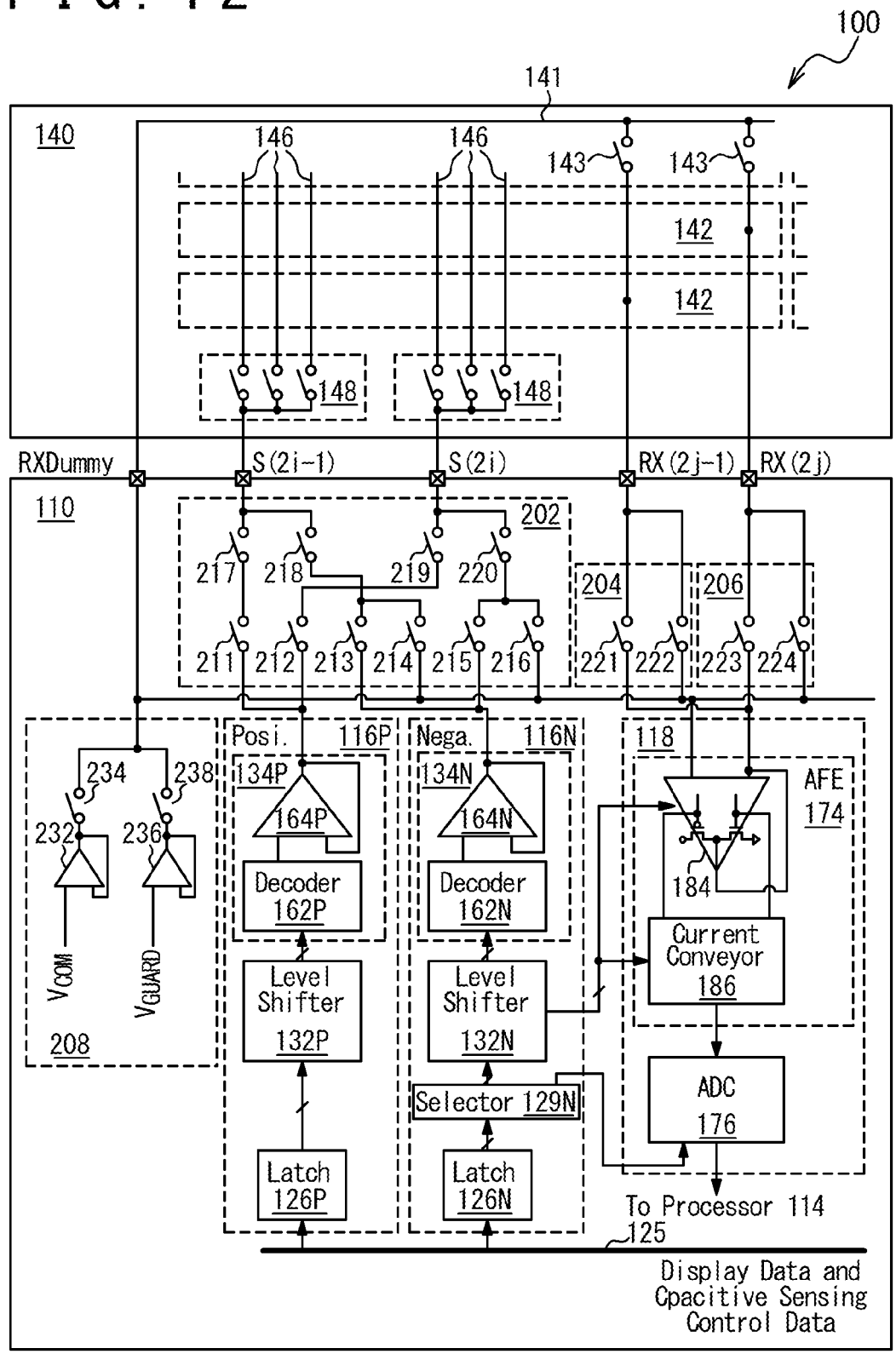
FIG. 12 illustrates a partial example configuration of a processing system, according to one or more embodiments.

FIG. 12 illustrates a partial example configuration of the processing system 110, according to other embodiments. In the illustrated embodiment, similarly to the embodiment illustrated in FIG. 5, the processing system 110 includes a common bus 125 configured to deliver both the display data and the capacitive sensing control data to the positive source driver circuits 116P and the negative source driver circuits 116N. The latch 126P of each positive source driver circuit 116P and the latch 126N of each negative source driver circuit 116N are configured to latch the display data during a display update period. The latch 126N is further configured to latch the capacitive sensing control data during a capacitive sensing period. Each negative source driver circuit 116N includes a selector 129N configured to forward selected part of the data held by the latch 126N to the level shifter 132N. The selector 129N may be configured to forward the display data to the level shifter 132N during the display update period. The selector 129N may be further configured to forward part of the capacitive sensing control data other than ADC setting parameters to the level shifter 132N during the proximity sensing period while forwarding the ADC setting parameters to the ADC 176.

Figure 13:
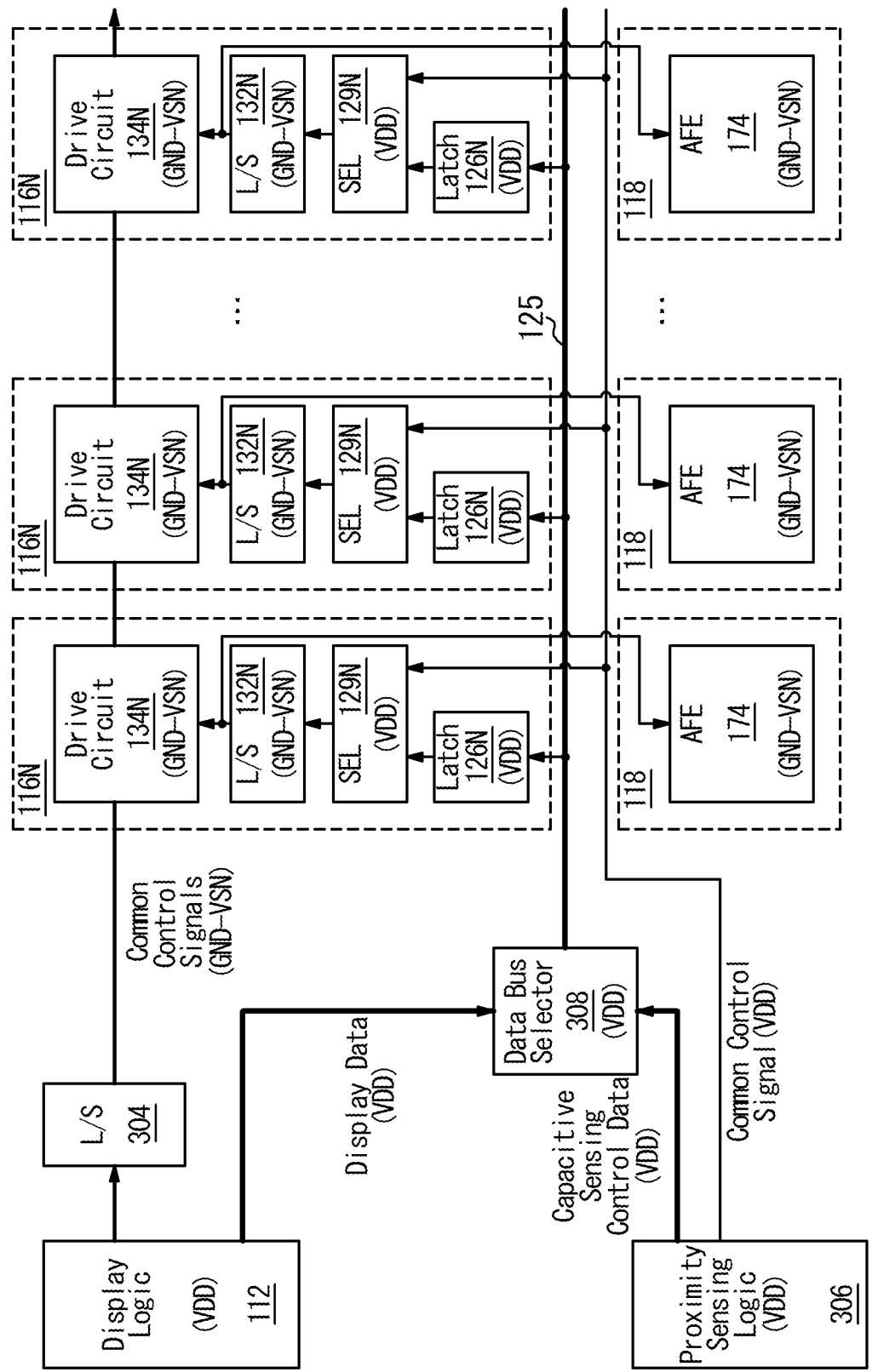
FIG. 13 illustrates an example delivery of display data and capacitive sensing control data together with example voltage ranges used to operate components integrated in negative source driver circuits and the capacitive sensing circuits, according to one or more embodiments.

FIG. 13 illustrates an example delivery of display data and capacitive sensing control data to the negative source driver circuits 116N together with voltage ranges used to operate components integrated in the negative source driver circuits 116N and the capacitive sensing circuits 118, according to one or more embodiments. In the illustrated embodiment, the common bus 125 is used to deliver both the display data and the capacitive sensing control data to the negative source driver circuits 116N. More specifically, the processing system 110 further includes a data bus selector 308 configured to select the display data received from display logic circuitry 112 or the capacitive sensing control data received from proximity sensing logic circuitry 306 and send the selected data to the common bus 125. The proximity sensing logic circuitry 306 is further configured to generate a common control signal that controls the selectors 129N in the negative source driver circuits 116N.

In the illustrated embodiments, the display logic circuitry 112, the latches 126N and the selectors 129N of the negative source driver circuits 116N, the proximity sensing logic circuitry 306, and the data bus selector 308 are configured to operate in the voltage range from the circuit ground level GND to the logic level VDD, while the drive circuits 134N of the negative source driver circuits 116N and the AFEs 174 of the capacitive sensing circuits 118 are configured to operate in the voltage range from the negative analog power supply level VSN to the circuit ground level GND.

During a display update period, the data bus selector 308 selects the display data received from display logic circuitry 112, and the display data are transferred to the latches 126N over the common bus 125 with signals of the voltage range from the circuit ground level GND to the logic level VDD. The level shifters 132N are configured to generate, based on the display data received from the latches 126N, first level-shifted outputs that have voltage levels in the voltage range from the negative analog power supply level VSN to the circuit ground level GND. The drive circuits 134N are configured to generate output voltages based on the first level-shifted outputs. The output voltages are provided to corresponding display elements 144 to update the same.

During a proximity sensing period, the data bus selector 308 selects the capacitive sensing control data received from the proximity sensing logic circuitry 306, and the capacitive sensing control data are transferred to the latches 126N over the common bus 125 with signals of the voltage range from the circuit ground level GND to the logic level VDD. The selectors 129N are configured to forward selected part of the capacitive sensing control data held by the latches 126N to the level shifters 132N and forward different selected part of the capacitive sensing control data to the ADCs 176 (illustrated in FIG. 12). In one implementation, part of the capacitive sensing control data other than ADC setting parameters may be forwarded to the level shifters 132N and the ADC setting parameters are forwarded to the ADCs 176.

The level shifters 132N are configured to generate, based on the part of the capacitive sensing control data received from the selectors 129N, second level-shifted outputs in the voltage range from the negative analog power supply level VSN to the circuit ground level GND. The AFEs 174 are configured to generate current outputs corresponding to resulting signals received from corresponding sensor electrodes 142 under control of the second level-shifted outputs. The generated current outputs are provided to ADCs 176 (illustrated in FIG. 12) to generate capacitive sensing outputs. The ADCs 176 are configured to generate capacitive sensing outputs based on the current outputs received from the AFEs 174 under the control of the ADC setting parameters received from the selectors 129N.

The display logic circuitry 112 may be further configured to control the drive circuits 134N as is the case with the embodiment illustrated in FIG. 11. In such implementations, the display logic circuitry 112 may be configured to generate and provide common control signals to the drive circuits 134N via a level shifter 304 configured to provide level-shifting (or voltage level translation). The display logic circuitry 112 may be configured to generate the common control signals in the voltage range from the circuit ground level GND to the logic level VDD, while the common control signals output from the level shifter 304 have voltage levels in the voltage range from the negative analog power supply level VSN to the circuit ground level GND.

Figure 14:
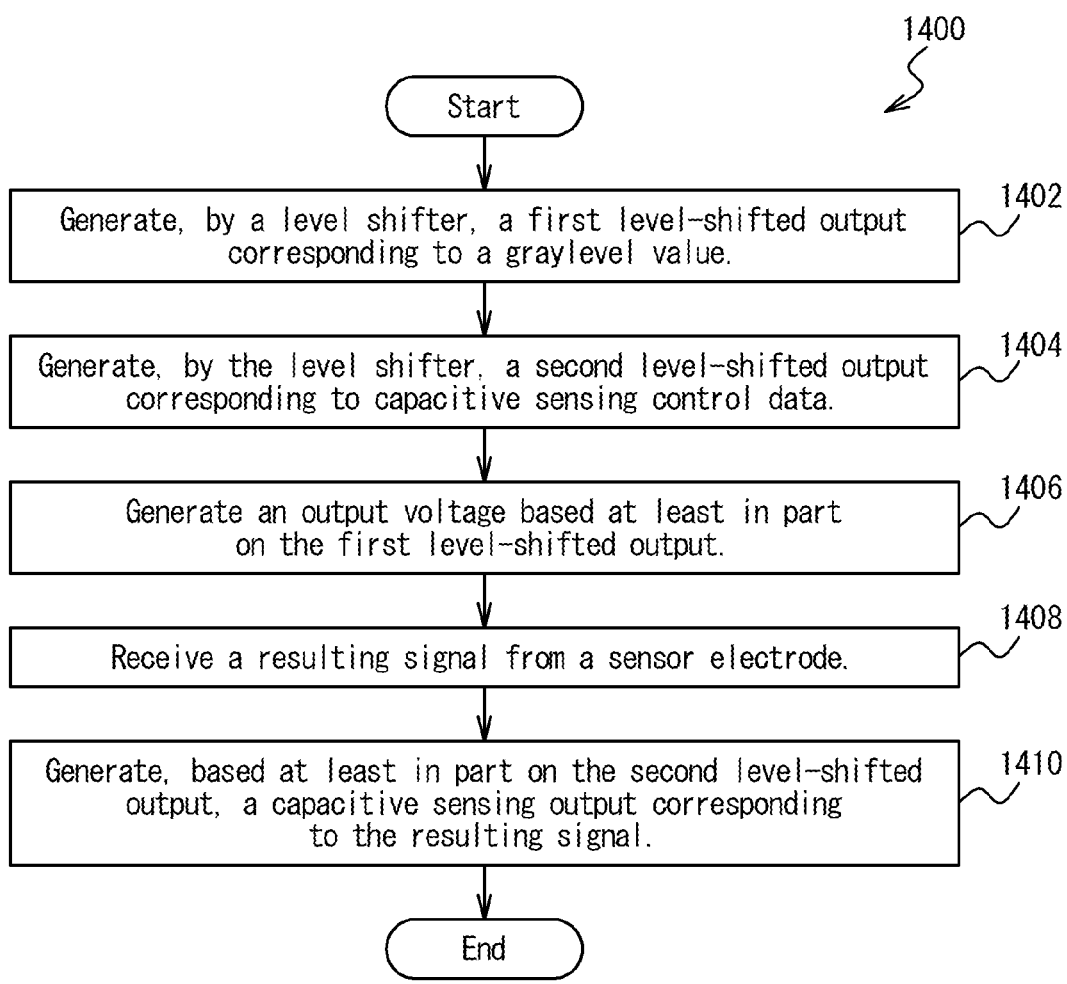
FIG. 14 illustrates example steps for operating a processing system, according to one or more embodiments To facilitate understanding, identical reference numerals have been used, where possible, to designate identical elements that are common to the figures. It is contemplated that elements disclosed in one embodiment may be beneficially utilized in other embodiments without specific recitation. Suffixes may be attached to reference numerals for distinguishing identical elements from each other. The drawings referred to herein should not be understood as being drawn to scale unless specifically noted. Also, the drawings are often simplified and details or components omitted for clarity of presentation and explanation. The drawings.

Method 1400 of FIG. 14 illustrates steps for operating a processing system (e.g., the processing system 110 illustrated in FIG. 2), according to one or more embodiments. It should be noted that the order of the steps may be altered from the order illustrated.

At step 1402, a level shifter (e.g., the level shifters 132 and 132N illustrated in FIGS. 3, 5, 7, and 12) generates a first level-shifted output corresponding to a graylevel value. The graylevel value may be defined for a selected display element (e.g., a display element 144 illustrated in FIG. 2) of a display panel (e.g., the display panel 140). At step 1404, the level shifter generates a second level-shifted output corresponding to capacitive sensing control data. At step 1406, a drive circuit (e.g., the drive circuits 134, 134N illustrated in FIGS. 3, 5, 7, and 12) generates an output voltage based on the first level-shifted output. The output voltage may be provided to a selected display element 144 to update the selected display element 144 with the output voltage. At step 1408, a capacitive sensing circuit (e.g., the capacitive sensing circuit 118 illustrated in FIGS. 3, 5, 7, and 12) receives a resulting signal from a sensor electrode (e.g., a sensor electrode 142 illustrated in FIG. 2). At step 1410, the capacitive sensing circuit generates, based at least in part on the second level-shifted output, a capacitive sensing output corresponding to the resulting signal. The capacitive sensing output may be used to generate positional information of an input object (e.g., the input object 130 illustrated in FIG. 1). Steps 1402 and 1406 may be implemented during a display update period, and step 1404, 1408 and 1410 may be implemented during a proximity sensing period.

While many embodiments have been described, those skilled in the art, having benefit of this disclosure, will appreciate that other embodiments can be devised which do not depart from the scope. Accordingly, the scope of the invention should be limited only by the attached claims.

What is claimed is:

1. A processing system, comprising:
   a level shifter configured to:
      generate a first level-shifted output corresponding to a graylevel value; and
      generate a second level-shifted output corresponding to capacitive sensing control data;
   a drive circuit configured to generate an output voltage based at least in part on the first level-shifted output; and
   a capacitive sensing circuit configured to:
      receive a resulting signal from a sensor electrode; and
      generate, based at least in part on the second level-shifted output, a capacitive sensing output corresponding to the resulting signal.

2. The processing system of claim 1, wherein the level shifter is configured to generate the second level-shifted output during a proximity sensing period and the capacitive sensing circuit is configured to generate the capacitive sensing output during the proximity sensing period.

3. The processing system of claim 1, wherein the level shifter is configured to generate the first level-shifted output during a display update period and the drive circuit is configured to generate the output voltage during the display update period.

4. The processing system of claim 1, further comprising:
   a selector configured to select the capacitive sensing control data or display data comprising the graylevel value, wherein the level shifter is further configured to:
      generate the first level-shifted output in response to the display data being selected by the selector, and
      generate the second level-shifted output in response to the capacitive sensing control data being selected by the selector.

5. The processing system of claim 1, further comprising:
   a latch circuit configured to latch the capacitive sensing control data, wherein the level shifter is further configured to generate the second level-shifted output based at least in part on the capacitive sensing control data latched by the latch circuit.

6. The processing system of claim 5, wherein the latch circuit is further configured to hold the capacitive sensing control data during a proximity sensing period, the second level-shifted output generated based at least in part on the capacitive sensing control data held by the latch circuit.

7. The processing system of claim 1, further comprising:
   a latch circuit configured to latch display data comprising the graylevel value, the first level-shifted output generated based at least in part on the display data latched by the latch circuit.

8. The processing system of claim 7, wherein the latch circuit is further configured to:
   hold the display data during a display update period, the first level-shifted output generated based on the display data held by the latch circuit.

9. The processing system of claim 1, wherein the capacitive sensing circuit is further configured to operate on a negative power supply voltage.

10. The processing system of claim 9, wherein the first level-shifted output has a first negative voltage level, the second level-shifted output has a second negative voltage level, and the output voltage has a third negative voltage level.

11. An input device, comprising:
    a sensor electrode;
    a display panel comprising a pixel element; and
    a processing system, comprising:
       a level shifter configured to:
          generate a first level-shifted output corresponding to a graylevel value; and
          generate a second level-shifted output corresponding to capacitive sensing control data;
       a drive circuit configured to generate, based at least in part on the first level-shifted output, an output voltage; and
       a capacitive sensing circuit configured to:
          receive a resulting signal from a sensor electrode; and
          generate, based at least in part on the second level-shifted output, a capacitive sensing output corresponding to the resulting signal.

12. The input device of claim 11, wherein the level shifter is configured to generate the second level-shifted output during a proximity sensing period and the capacitive sensing circuit is configured to generate the capacitive sensing output during the proximity sensing period.

13. The input device of claim 11, wherein the level shifter is configured to generate the first level-shifted output during a display update period, and
    wherein the drive circuit is configured to generate the output voltage to update the pixel element during the display update period.

14. The input device of claim 11, further comprising:
    a selector configured to select the capacitive sensing control data or display data comprising the graylevel value,
    wherein the level shifter is further configured to:
       generate the first level-shifted output in response to the display data being selected by the selector, and
    generate the second level-shifted output in response to the capacitive sensing control data being selected by the selector.

15. The input device of claim 11, further comprising:
    a latch circuit configured to latch the capacitive sensing control data,
    wherein the level shifter is further configured to generate the second level-shifted output based at least in part on the capacitive sensing control data latched by the latch circuit.

16. The input device of claim 11, further comprising:
    a latch circuit configured to latch display data comprising the graylevel value, the first level-shifted output generated based at least in part on the display data latched by the latch circuit.

17. The input device of claim 11, wherein the capacitive sensing circuit is further configured to operate on a negative power supply voltage.

18. A method, comprising:

generating, by a level shifter, a first level-shifted output corresponding to a graylevel value; and generating, by the level shifter, a second level-shifted output corresponding to capacitive sensing control data;

generating an output voltage based at least in part on the first level-shifted output;

receiving a resulting signal from a sensor electrode; and generating, based at least in part on the second level-shifted output, a capacitive sensing output corresponding to the resulting signal.

19. The method of claim 18, further comprising:

selecting the capacitive sensing control data or display data comprising the graylevel value, wherein generating the first level-shifted output comprises generating the first level-shifted output in response to the display data being selected, and wherein generating the second level-shifted output comprises generating the second level-shifted output in response to the capacitive sensing control data being selected.

20. The method of claim 18, further comprising:

latching, by a latch circuit, the capacitive sensing control data; and latching, by the latch circuit, display data comprising the graylevel value, wherein generating the first level-shifted output comprises generating the first level-shifted output based at least in part on the display data latched by the latch circuit, and wherein generating the second level-shifted output comprises generating the second level-shifted output based at least in part on the capacitive sensing control data latched by the latch circuit.

* * * * *